US007026096B2

(12) United States Patent
Hotta

(10) Patent No.: US 7,026,096 B2
(45) Date of Patent: Apr. 11, 2006

(54) METHOD FOR PRODUCTION OF SUPPORT FOR LITHOGRAPHIC PRINTING PLATE PRECURSOR AND SUPPORT FOR LITHOGRAPHIC PRINTING PLATE PRECURSOR

(75) Inventor: Yoshionori Hotta, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 27 days.

(21) Appl. No.: 10/653,928

(22) Filed: Sep. 4, 2003

(65) Prior Publication Data

US 2004/0053167 A1 Mar. 18, 2004

(30) Foreign Application Priority Data

Sep. 6, 2002 (JP) ......................... P. 2002-261402

(51) Int. Cl.
*G03F 7/14* (2006.01)
*G03F 7/09* (2006.01)
*B41N 1/00* (2006.01)
*B41N 3/00* (2006.01)

(52) U.S. Cl. ................... 430/278.1; 430/302; 101/455; 101/459; 428/654

(58) Field of Classification Search ............. 430/270.1, 430/276.1, 278.1, 302; 428/654; 101/455, 101/459
See application file for complete search history.

(56) References Cited

U.S. PATENT DOCUMENTS 6,468,717 B1 * 10/2002 Kita et al. ............... 430/278.1
2002/0182538 A1 * 12/2002 Tomita et al. ........... 430/278.1
2003/0031860 A1 * 2/2003 Hotta et al. ................. 428/336
2003/0148207 A1 * 8/2003 Maemoto et al. ........... 430/138

FOREIGN PATENT DOCUMENTS

| | | | |
|---|---|---|---|
| EP | 1 219 464 | A2 * | 7/2002 |
| EP | 1 247 644 | A2 * | 10/2002 |
| EP | 1 266 753 | A2 | 12/2002 |
| EP | 1 279 520 | A1 * | 1/2003 |
| JP | 2002-116548 | A | 4/2002 |
| JP | 2002-116549 | A | 4/2002 |
| WO | WO 02/082183 | A1 | 10/2002 |

OTHER PUBLICATIONS

European Search Report dated Dec. 10, 2004.

* cited by examiner

*Primary Examiner*—Richard L. Schilling
(74) *Attorney, Agent, or Firm*—Sughrue Mion, PLLC

(57) ABSTRACT

A method for the production of a support for a lithographic printing plate precursor that comprises providing on a grained aluminum support having an anodic oxide film formed thereon a layer of inorganic compound particles having a major axis larger than a pore diameter of the anodic oxide film and treating the layer of inorganic compound particles with a treating solution capable of dissolving the inorganic compound particles, thereby fusing together the inorganic compound particles to form a layer of the inorganic compound.

6 Claims, 1 Drawing Sheet

METHOD FOR PRODUCTION OF SUPPORT FOR LITHOGRAPHIC PRINTING PLATE PRECURSOR AND SUPPORT FOR LITHOGRAPHIC PRINTING PLATE PRECURSOR

FIELD OF THE INVENTION

The present invention relates to a method for the production of a support for a lithographic printing plate precursor and a support for a lithographic printing plate precursor. In particular, it relates to a method for the production of a support for a lithographic printing plate precursor and a support for a lithographic printing plate precursor, which is used for a so-called direct plate-making lithographic printing plate precursor for an infrared laser that is capable of image recording by infrared scanning exposure based on digital signals, for example, from a computer and directly plate-making.

BACKGROUND OF THE INVENTION

In recent years, with the development of image formation technology direct plate-making techniques without using film originals wherein letter originals and image originals are directly formed on a printing plate precursor by the scanning a narrow laser beam on the surface of printing plate precursor have been drawn attention.

Image-forming materials for such techniques include so-called thermal type positive-working lithographic printing plate precursors in which an infrared absorber included in a heat-sensitive layer reveals a light-heat conversion function to generate heat upon exposure and by the heat the exposed area of heat-sensitive layer becomes alkali-soluble, whereby a positive image is formed and so-called thermal type negative-working lithographic printing plate precursors in which by the heat generated, a radical initiator or an acid generator forms a radical or an acid and a radical polymerization reaction or an acid crosslinking reaction proceeds to insolubilize the exposed area, whereby a negative image is formed. Specifically, according to the image formation of thermal type the heat is generated from a light-heat conversion substance in the heat-sensitive layer upon exposure to laser beam and cause an image-forming reaction.

However, in case of using a grained aluminum support having an anodic oxide film formed thereon, since the heat conductivity of aluminum support is extremely high in comparison with the heat-sensitive layer, heat generated in the vicinity of the interface of heat-sensitive layer and aluminum support diffuses into the support without sufficiently using for the image formation and as a result, the following phenomenon occurs at the interface of heat-sensitive layer and aluminum support.

In the positive heat-sensitive layer, the heat diffuses into the inside of support and the alkali-solubilizing reaction proceeds insufficiently, resulting in the occurrence of remaining film in the inherent non-image area to cause a problem of decrease in sensitivity. This is an essential problem in the positive heat-sensitive layer.

Further, in the thermal type positive-working lithographic printing plate precursors, infrared absorbers having the light-heat conversion function are indispensably used. However, such infrared absorbers have problems in that they have a low solubility due to their relatively large molecular weights and in that since those adsorbed to minute openings formed by the anodic oxidation are hardly removed, the remaining film is apt to occur in a development step using an alkali developer.

On the other hand, in the negative heat-sensitive layer, the heat diffuses into the inside of support and the insolubilization of heat-sensitive layer to a developer becomes insufficient in the vicinity of the interface of heat-sensitive layer and aluminum support, resulting in the occurrence of problems in that the image is not sufficiently formed in the area wherein the image should be inherently formed and dissolved out during the development and in that even if, the image is formed, it is easily peeled off during printing.

Recently, a large number of investigations and various proposals have been made with respect to lithographic printing plate precursors, which can be mounted as they are after image exposure on a printing machine to conduct printing. For example, lithographic printing plate precursors capable of forming an image by coalescence of fine particles upon heat have been proposed.

However, such lithographic printing plate precursors have problems in that the sensitivity thereof is low because of the heat conduction to an aluminum support and in that when the coalescence of fine particles is insufficient, the strength of image area in the heat-sensitive layer degrades, resulting in insufficient press life.

In order to solve these problems, an attempt to enlarge micropores present in an anodic oxide film has been made from the standpoint of preventing the diffusion of heat generated in the heat-sensitive layer into the aluminum support.

Also, from the same standpoint, an attempt has been made for sealing the micropores by immersing an aluminum support having provided anodic oxide film on the surface of an aluminum plate in hot water or a solution containing an inorganic salt or an organic salt in hot water or exposing the aluminum support to water vapor bath as described, for example, in Patent Documents 1 and 2 described below.

However, the method of enlarging micropores present in an anodic oxide film can achieve improvements in sensitivity and press life but accompanied with degradation of staining resistance. The term “staining resistance” as used herein means a property of preventing the occurrence of stain in the non-image area in the case where printing is interrupted in the course of printing and a lithographic printing plate is allowed to stand on a printing machine and then the printing is restarted. In contrast therewith, according to the method of sealing micropores the staining resistance is improved although the sensitivity and press life are degraded. Thus, sufficiently satisfactory levels of such properties cannot be attained in these methods.

Patent Document 1: JP-A-2002-116548 (the term “JP-A” as used herein means an “unexamined published Japanese patent application”), page 8.

Patent Document 2: JP-A-2002-116549, page 2.

SUMMARY OF THE INVENTION

Therefore, an object of the invention is to provide a method for the production of a support for a lithographic printing plate precursor and a support for a lithographic printing plate precursor that is used for a lithographic printing plate precursor, in which the above-described defects in the prior art are overcome so that heat can be efficiently utilized for the image formation, high sensitivity, excellent press life, excellent hydrophilicity and reduction in a number of inked sheets are achieved, and the occurrence of stain in the non-image area is prevented.

Other objects of the invention will become apparent from the following description.

As a result of the intensive investigations to attain the above-described objects, it has been found that the above-described objects can be accomplished by using a support for a lithographic printing plate precursor produced according to the methods described below.

Specifically, the invention includes the following items.

(1) A method for the production of a support for a lithographic printing plate precursor that comprises providing on a grained aluminum support having an anodic oxide film formed thereon a layer of inorganic compound particles having a major axis larger than a pore diameter of the anodic oxide film and treating the layer of inorganic compound particles with a treating solution capable of dissolving the inorganic compound particles, thereby fusing together the inorganic compound particles to form a layer of the inorganic compound.

(2) The method for the production of a support for a lithographic printing plate precursor as described in item (1) above, wherein the treating solution comprises a compound containing at least one of fluorine and silicon.

(3) A support for a lithographic printing plate precursor that comprises a grained aluminum support having an anodic oxide film formed thereon and a layer of inorganic compound provided on the anodic oxide film, wherein a ratio of pore diameter of the layer of inorganic compound to pore diameter of the anodic oxide film is not less than 1.5 and a ratio of fluorine concentration or a ratio of silicon concentration of the layer of inorganic compound to the anodic oxide film is not less than 2.

DETAILED DESCRIPTION OF THE INVENTION

Figure 1:
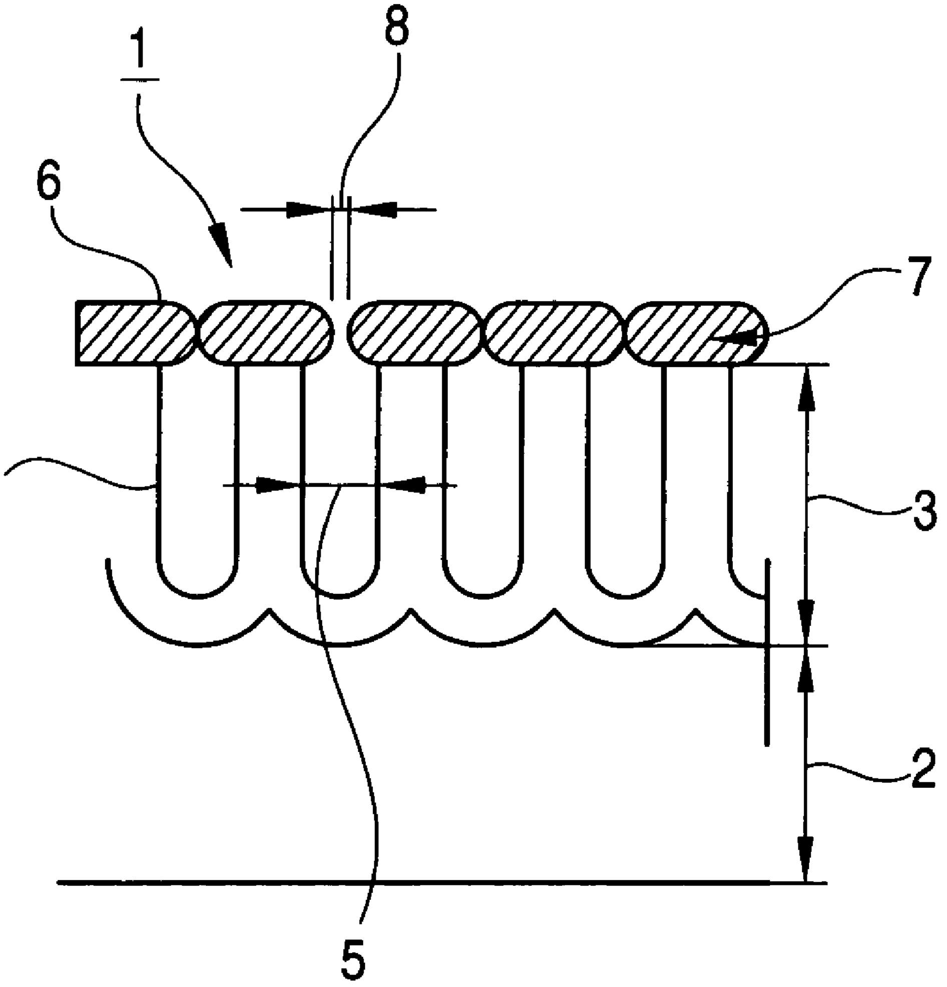
FIG. 1 is a schematic cross sectional view showing the support for a lithographic printing plate precursor according to the invention.

The invention will be described in more detail below.

FIG. 1 is a schematic cross sectional view of the support for a lithographic printing plate precursor according to the invention. As shown in FIG. 1, the support for a lithographic printing plate precursor 1 according to the invention comprises an aluminum plate 2 having an anodic oxide film 3 formed thereon and a layer 7 of inorganic compound formed from inorganic compound particles provided on the anodic oxide film 3, wherein the inorganic compound particles 6 have a major axis larger than an internal diameter 5 of micropore 4 in the anodic oxide film 3. The layer 7 of inorganic compound may have micropores, but preferably it dose not have such micropores. When the micropore is present in the layer of inorganic compound, a diameter 8 of the micropore is preferably ⅔ or less of the pore diameter of the anodic oxide film. The micropore 4 present in the anodic oxide film 3 is closed at its opening with the layer 7 of inorganic compound as described in detail below, but has a void inside. According to conventional sealing treatment, a reaction of boehmite treatment proceeds inside the micropore present in the anodic oxide film and the micropore is filled with the reaction product and the void is almost lost. The invention is greatly different from conventional sealing treatment from the viewpoint that the micropore is sealed only in its opening and still has the void inside.

In the method for the production of a support for a lithographic printing plate precursor and the support for a lithographic printing plate precursor according to the invention, which is suitably applied to a thermal type lithographic printing plate precursor, the specific layer of inorganic compound particles is provided on the micropore present in the anodic oxide film and the layer of inorganic compound particles is treated with a treating solution capable of dissolving the inorganic compound particles, thereby fusing together the inorganic compound particles to form a layer of the inorganic compound as described above. Thus, both heat insulation effect due to the layer of inorganic compound and heat insulation effect due to the void of micropore are obtained so that the diffusion of heat from the heat-sensitive layer to the aluminum support can be sufficiently restrained and the heat can be efficiently utilized for the image formation. Therefore, a support for a lithographic printing plate precursor that is suitably employed for a lithographic printing plate precursor, which has high sensitivity and excellent press life and in which the occurrence of stain in the non-image area is restrained, can be obtained according to the invention.

[Layer of Inorganic Compound Particles]

<Formation of Layer of Inorganic Compound Particles>

An inorganic compound particle for use in the layer of inorganic compound particles, which is provided on an anodic oxide film of a grained aluminum plate is not particularly restricted as far as one having a major axis larger than a pore diameter of the anodic oxide film. An average particle diameter of the inorganic compound particle is ordinarily from 8 to 800 nm, preferably from 10 to 500 nm, and more preferably from 10 to 150 nm. The inorganic compound particle having an average particle diameter of 8 nm or more has less fear that the particle enters into the micropore present in the anodic oxide film so that the effect for obtaining high sensitivity can be attained. The inorganic compound particle having an average particle diameter of 800 nm or less has sufficient adhesion to the heat-sensitive layer, thereby achieving excellent press life. A thickness of the layer of inorganic compound particles is preferably from 8 to 800 nm, and more preferably from 10 to 500 nm.

Heat conductivity of the inorganic compound particle for use in the invention is preferably not more than 60 W(m·K), more preferably not more than 40 W/(m·K), and particularly preferably from 0.3 to 10 W/(m·K). When the heat conductivity of the inorganic compound particle is not more than 60 W/(m·K), the diffusion of heat into to the aluminum support can be sufficiently restrained so that the effect for obtaining high sensitivity can be fully attained.

Although a method of providing the layer of inorganic compound particles is not particularly restricted, coating is the most convenient method. Specifically, an aqueous solution or organic solvent solution containing the inorganic compound particles is coated on the surface of support by a coating method, for example, a whirler coating method or a bar coating method and dried, thereby easily forming the layer of inorganic compound particles.

A method of electrolysis treatment of the aluminum support with an electrolyte containing the inorganic compound particle using a direct current or an alternating current is also preferably employed. A waveform of the alternating current used in the electrolysis treatment includes, for example, a sign waveform, a rectangular waveform, a triangular waveform and a trapezoidal waveform. A frequency of the alternating current is preferably from 30 to 200 Hz, and more preferably from 40 to 120 Hz in view of costs for the production of electric power unit. In case of using an alternating current of trapezoidal waveform, time tp necessary for reaching the current from 0 to a peak value is preferably from 0.1 to 2 msec, and more preferably from 0.3 to 1.5 msec. When the time tp is less than 0.1 msec, due to impedance of power supply circuit a large amount of power supply voltage is necessary at the time of launching the current, resulting in increase in the costs of power supply facility in sometimes.

As the inorganic compound particles, $Al_2O_3$, $TiO_2$, $SiO_2$ and $ZrO_2$ are preferably used individually or in combination of two or more thereof. The electrolyte is prepared, for example, by suspending the inorganic compound particles in water so as to make the content thereof from 0.01 to 20% by weight. In order to charge the particles positively or negatively, a pH of the electrolyte can be controlled, for example, by adding sulfuric acid thereto. The electrolysis treatment is performed, for example, using a direct current, the aluminum support as a cathode and the electrolyte as described above under conditions of voltage of from 10 to 200 V and a period of from 1 to 600 seconds.

<Sealing Treatment of Layer of Inorganic Compound Particles>

In the method for the production of a support for lithographic printing plate precursor according to the invention, the layer of inorganic compound particles provided on the anodic oxide film is then subjected to sealing treatment.

The sealing treatment of the layer of inorganic compound particles means a treatment of the layer of inorganic compound particles with a treating solution (hereinafter also simply referred to as a sealing treatment solution sometimes) capable of dissolving the inorganic compound particles, thereby fusing together the inorganic compound particles.

The treating solution capable of dissolving the inorganic compound particles is not particularly restricted, but preferably comprises a compound containing at least one of fluorine and silicon atoms. Specifically, an aqueous solution containing at least one of a fluorine compound and a silicic acid compound is preferably used. By using the treating solution containing a fluorine and/or silicon compound, a support for lithographic printing plate precursor, which provides a lithographic printing plate excellent in the staining resistance, can be obtained.

As the fluorine compound for use in the invention, a metal fluoride is preferably exemplified.

Specific examples thereof include sodium fluoride, potassium fluoride, calcium fluoride, magnesium fluoride, sodium hexafluorozirconate, potassium hexafluorozirconate, sodium hexafluorotitanate, potassium hexafluorotitanate, hexafluorozirconium hydroacid, hexafluorotitanium hydroacid, ammonium hexafluorozirconate, ammonium hexafluorotitanate, hexafluorosilicic acid, nickel fluoride, iron fluoride, fluorophosphoric acid and ammonium fluorophosphate.

As the silicic acid compound for use in the invention, silicic acid and a silicate are exemplified, and an alkali metal silicate is preferably used.

Specific examples thereof include sodium silicate, potassium silicate and lithium silicate. Among them, sodium silicate and potassium silicate are preferred.

The sodium silicate includes, for example, sodium silicate No. 3, sodium silicate No. 2, sodium silicate No. 1, sodium orthosilicate, sodium sesqui-silicate and sodium metasilicate. The potassum silicate includes, for example, potassium silicate No. 1. An aluminosilicate including aluminum and a borosilicate including boric acid may also be used.

The silicic acid includes, for example, orthosilicic acid, metasilicic acid, metadisilicic acid, metatrisilicic acid and metatetrasilicic acid.

With respect to the concentration of each of the compounds in the sealing treatment solution, the concentration of fluorine compound is preferably not less than 0.01% by weight, more preferably not less than 0.05% by weight, and particularly preferably not less than 0.1% by weight from the viewpoint of the sealing of the layer of inorganic compound particles, and preferably not more than 10% by weight, more preferably not more than 1% by weight, and particularly preferably not more than 0.5% by weight from the viewpoint of the staining resistance.

The concentration of silicic acid compound in the sealing treatment solution is preferably not less than 0.01% by weight, more preferably not less than 0.1% by weight, and particularly preferably not less than 1% by weight from the viewpoint of the staining resistance, and preferably not more than 10% by weight, more preferably not more than 7% by weight, and particularly preferably not more than 5% by weight from the viewpoint of the press life.

When the sealing treatment solution contains both the fluorine compound and the silicic acid compound, a ratio of the compounds in the sealing treatment solution is not particularly restricted, but a weight ratio of fluorine compound to silicic acid compound is preferably from 5/95 to 95/5, and more preferably from 20/80 to 80/20.

In addition, the aqueous solution containing at least one of the fluorine compound and silicic acid compound may contain an appropriate amount of a hydroxide, for example, sodium hydroxide, potassium hydroxide or lithium hydroxide in order to increase a pH value thereof.

The aqueous solution containing the fluorine compound and/or silicic acid compound may contain an alkaline earth metal salt or a salt of Group IV (Group IVB) metal. Examples of the alkaline earth metal salt include a water-soluble salt thereof, for example, a nitrate, e.g., calcium nitrate, strontium nitrate, magnesium nitrate or barium nitrate, a sulfate, a hydrochloride, a phosphate, an acetate, an oxalate and a borate. Examples of the salt of Group IV (Group IVB) metal include titanium tetrachloride, titanium trichloride, potassium titanium fluoride, potassium titanium oxalate, titanium sulfate, titanium tetraiodide, zirconium chloroxide, zirconium dioxide, zirconium oxychloride and zirconium tetrachloride. The alkaline earth metal salts and salts of Group IV (Group IVB) metals can be used individually or as a mixture of two or more thereof.

The temperature of the sealing treatment solution is preferably not less than 10° C., and more preferably not less than 20° C., and the upper limit thereof is preferably not more than 100° C., and more preferably not more than 80° C.

The pH of the sealing treatment solution is preferably not less than 8, and more preferably not less than 10, and the upper limit thereof is preferably not more than 13, and more preferably not more than 12.

A method of treatment with the aqueous solution containing at least one of the fluorine compound and silicic acid compound is not particularly restricted and includes, for example, a dip method and a spray method. Such methods may be used individually once or plural times, or in combination of two or more thereof.

Among others, the dip method is preferably used. In the case where the dip method is used for the treatment, the treatment time is preferably not less than one second, and more preferably not less than 3 seconds, and the upper limit thereof is preferably not more than 600 seconds, and more preferably not more than 120 seconds.

As described above, in the method for production of a support for a lithographic printing plate precursor and the support for a lithographic printing plate precursor according to the invention, an aluminum plate is grained and provided with an anodic oxide film, the layer of inorganic compound particles is provided on the anodic oxide film and the layer of inorganic compound particles is treated with a treating solution capable of dissolving the inorganic compound particles, thereby fusing together the inorganic compound particles. Thus, both heat insulation effect due to the layer of inorganic compound particles and heat insulation effect due to the void of micropore are obtained.

According to a preferred embodiment, the support for a lithographic printing plate precursor has a ratio of pore diameter of the layer of inorganic compound to pore diameter of the anodic oxide film of not less than 1.5, and a ratio of fluorine (or silicon) concentration of the layer of inorganic compound to the anodic oxide film of not less than 2.

When the ratio of pore diameter of the layer of inorganic compound to pore diameter of the anodic oxide film is less than 1.5, the effect of sealing is insufficient and the components of heat-sensitive layer penetrate into the pores of the anodic oxide film so that the residue of the heat-sensitive layer, which is called a residual film, remains after development processing, thereby causing problems, for example, background stain. In addition, the sealing treatment solution for fusing together the inorganic compound particles also penetrates into the pores of the anodic oxide film to react therewith, whereby the high degree of void, which leads to the high sensitivity, cannot be maintained. On the other hand, a case wherein the ratio of fluorine concentration of the layer of inorganic compound to the anodic oxide film or the ratio of silicon concentration of the layer of inorganic compound to the anodic oxide film is less than 2 means that the sealing treatment solution penetrates into the pores of the anodic oxide film to react therewith, whereby the high degree of void, which leads to the high sensitivity, cannot be maintained.

[Aluminum Support]

<Aluminum Plate (Rolled Aluminum Plate)>

An aluminum plate for use in the invention is composed of dimensionally stable metal containing aluminum as the main component, including aluminum and an aluminum alloy. Besides a pure aluminum plate, an alloy plate containing aluminum as the main component and trace amounts of foreign elements and a plastic film or paper laminated or deposited with aluminum or aluminum alloy are also used. In addition, the composite sheet of a polyethylene terephthalate film and an aluminum sheet bonded thereon as described in JP-B-48-18327 (the term "JP-B" as used herein means an "examined Japanese patent publication") may be used.

The term "aluminum plate" as used hereinafter means collectively various substrates composed of aluminum or aluminum alloy and various substrates having a layer composed of aluminum or aluminum alloy as described above. Examples of the foreign element contained in the aluminum alloy include silicon, iron, manganese, copper, magnesium, chromium, zinc, bismuth, nickel and titanium. The content of foreign metal in the aluminum alloy is not more than 10% by weight.

Although it is preferable to use a pure aluminum plate in the invention, since absolutely pure aluminum is difficult to produce due to restrictions of refining technology, plates of aluminum containing trace amounts of foreign elements may be employed. As describe above, the aluminum plate for use in the invention has no particular restriction in its composition. Thus, any of hitherto known and widely used aluminum alloy plates, e.g., JIS A1050, JIS A1100, JIS A3005 or International Registered Alloy 3103A can be appropriately utilized. The aluminum plate for use in the invention has a thickness of approximately from 0.1 to 0.6 mm. The thickness of aluminum plate can be varied appropriately depending on the size of printing machine, the size of printing plate and the requests from users.

The aluminum support used in the method for production of a support for a lithographic printing plate precursor and the support for a lithographic printing plate precursor according to the invention has an anodic oxide film provided on the above-described aluminum plate. However, production process of the aluminum support may include various kinds of steps in addition to the anodic oxidation treatment, as described below.

<Surface Roughening Treatment (Graining Treatment)>

The aluminum plate is subjected to graining treatment to form preferable surface configuration. The graining treatment can be conducted using various methods, for example, a mechanical graining (mechanical roughening) method as described in JP-A-56-28893, a chemical etching method and an electrolytic graining method. Further, an electrochemical graining method in which the aluminum plate is electrochemically grained in a hydrochloric acid electrolyte or a nitric acid electrolyte, or a mechanical graining method, for example, a wire brush graining method in which the aluminum surface is scratched with metallic wires, a ball graining method in which the aluminum surface is grained with abrasive balls and abrasives or a brush graining method in which the aluminum surface is grained with a nylon brush and abrasives may be employed. The graining methods can be used individually or in combination of two or more thereof.

Of the methods described above, the electrochemical method of graining electrochemically in a hydrochloric acid electrolyte or a nitric acid electrolyte is preferably used for the formation of grained surface according to the invention. Preferred quantity of electricity is from 50 to 400 $C/dm^2$ in terms of anode quantity of electricity. More specifically, the electrolysis for graining is carried out in an electrolyte containing from 0.1 to 50% by weight of hydrochloric acid or nitric acid using a direct current or an alternating current under conditions that the electrolysis temperature is from 20 to 100° C., the electrolysis time is from one second to 30 minutes and the current density is from 10 to 100 $A/dm^2$. The electrochemical graining method can easily provide fine irregularity on the surface of aluminum plate and is also preferable in view of increasing adhesion between the heat-sensitive layer and the support.

According to the electrochemical surface roughening treatment, crater-like or honeycomb-like pits having an average diameter of approximately from 0.5 to 20 μm can be formed on the surface of aluminum plate in an area ratio of from 30 to 100%. The pits formed have functions of preventing stain in the non-image area of a printing plate and increasing press life. In the electrochemical treatment, the quantity of electricity, which is a product of electric current and time for applying the electric current, necessary for providing sufficient pits on the surface is an important factor for the electrochemical roughening. It is preferred to provide sufficient pits on the surface by a less amount of the quantity of electricity in view of energy saving. Surface roughness after the surface roughening treatment is preferably from 0.2 to 0.7 μm in terms of arithmetic average roughness (Ra) measured according to JIS B0601-1994 with a cutoff value of 0.8 mm and evaluation length of 3.0 mm. The above-described electrochemical graining method may be used in combination with other electrochemical graining method of different conditions or a mechanical graining method.

<Etching Treatment>

The aluminum plate subjected to the graining treatment is chemically etched with an acid or an alkali.

When an acid is used as an etching agent, it requires long time to destroy the fine structure. Thus, the use of an acid as the etching agent is disadvantageous for the application of the invention to an industrial scale. The use of an alkali as the etching agent can alleviate such disadvantage.

The alkali etching agent preferably used in the invention is not particularly restricted and includes, for example, sodium hydroxide, sodium carbonate, sodium aluminate, sodium metasilicate, sodium phosphate, potassium hydroxide and lithium hydroxide.

Conditions for the alkali etching treatment are not particularly restricted. Specifically, concentration of the alkali etching agent is preferably from 1 to 50% by weight, temperature of the alkali etching treatment is preferably from 20 to 100° C., and dissolution amount of aluminum is preferably from 0.01 to 20 $g/m^2$ and more preferably from 0.1 to 5 $g/m^2$.

After the etching treatment, washing with an acid is carried out for removing smut remaining on the surface of the aluminum plate. Examples of the acid used include nitric acid, sulfuric acid, phosphoric acid, chromic acid, hydrofluoric acid and borofluoric acid. In particular, the smut removal treatment after conducting the electrochemical surface roughening treatment is preferably performed by the method of bringing the surface into contact with a 15 to 65% by weight sulfuric acid solution having temperature of from 50 to 90° C. as described in JP-A-53-12739.

<Anodic Oxidation Treatment>

The thus treated aluminum plate is further subjected to anodic oxidation treatment. The anodic oxidation treatment can be conducted using methods conventionally employed in the field of art. Specifically, by applying a direct current or an alternating current to the aluminum plate in an aqueous solution or non-aqueous solution containing sulfuric acid, phosphoric acid, chromic acid, oxalic acid, sulfamic acid, benzenesulfonic acid, or a mixture of two or more thereof, an anodic oxide film is formed on the surface of aluminum plate.

In this case, the electrolyte used may contain components ordinarily included at least, for example, in an aluminum alloy plate, an electrode, tap water or groundwater. In addition, second and third components may be added to the electrolyte. The term "second and third components" as used herein includes an ion of metal, for example, Na, K, Mg, Li, Ca, Ti, Al, V, Cr, Mn, Fe, Co, Ni, Cu or Zn; a cation, for example, an ammonium ion; and an anion, for example, sulfate ion, carbonate ion, chloride ion, phophate ion, fluoride ion, sulfite ion, titanate ion, silicate ion or borate ion. The second and third components may be contained in concentration of approximately from 0 to 10,000 ppm.

The conditions for anodic oxidation treatment variously change depending on the electrolyte used, so they cannot be generalized. In general, however, it is appropriate that the electrolyte concentration is from 1 to 80% by weight, the electrolyte temperature is from 5 to 70° C., the current density is from 0.5 to 60 $A/dm^2$, the voltage is from 1 to 100 V and the electrolysis time is from 10 to 200 seconds.

Of the anodic oxidation treatments, the method wherein anodic oxidation is carried out in a sulfuric acid electrolyte under a high current density condition as described in British Patent 1,412,768 and the method wherein anodic oxidation is carried out using phosphoric acid as the electrolyte as described in U.S. Pat. No. 3,511,661 are preferred.

An amount of the anodic oxide film is preferably from 1 to 10 $g/m^2$ in the invention. When the amount is less than 1 $g/m^2$, the plate may be easily scratched. On the other hand, the amount exceeding 10 $g/m^2$ is disadvantageous from the economical point of view, since a large amount of electricity is required for the production. The amount of anodic oxide film is more preferably from 1.5 to 7 $g/m^2$, and particularly preferably from 2 to 5 $g/m^2$.

<Pore Widening Treatment>

The aluminum support having the anodic oxide film may be subjected to pore widening (PW) treatment, if desired, for the purpose of adjusting a void ratio of the anodic oxide film to a preferred range.

The pore widening treatment is carried out by immersing the aluminum support in an aqueous acid solution or an aqueous alkali solution in order to adjust a diameter of micropore in the anodic oxide film to, for example, from 8 to 500 nm, and preferably from 10 to 150 nm.

The aqueous acid solution used preferably includes an aqueous solution of sulfuric acid, phosphoric acid or a mixture thereof. The concentration of aqueous acid solution is preferably from 10 to 500 g/liter, and more preferably from 20 to 100 g/liter. The temperature of aqueous acid solution is preferably from 10 to 90° C., and more preferably from 40 to 70° C. The immersion time in aqueous acid solution is from 10 to 300 seconds, and more preferably from 30 to 120 seconds.

The aqueous alkali solution used preferably includes an aqueous solution of sodium hydroxide, potassium hydroxide, lithium hydroxide or a mixture thereof. The pH of the aqueous alkali solution is preferably from 11 to 14, and more preferably from 11.5 to 13.5. The temperature of aqueous alkali solution is from 10 to 90° C., and more preferably from 20 to 60° C. The immersion time in aqueous alkali solution is preferably from 5 to 300 seconds, and more preferably from 10 to 60 seconds.

The void ratio of the anodic oxide film in the support for lithographic printing plate precursor according to the invention is preferably from 20 to 70%, more preferably from 30 to 60%, and particularly preferably from 40 to 50%. When the void ratio of the anodic oxide film is not less than 20%, the diffusion of heat into to the aluminum support can be sufficiently restrained so that the effect for obtaining high sensitivity can be fully attained. When the void ratio of the anodic oxide film is more less than 70%, the occurrence of stain in the non-image area can be more restrained.

<Hydrophilic Surface Treatment>

According to the invention, the aluminum support subjected to the formation of the layer of inorganic compound particles and the sealing treatment of the layer of inorganic compound particles may further be immersed in an aqueous solution containing one or more hydrophilic compounds, thereby conducting hydrophilic surface treatment. Preferred examples of the hydrophilic compound include polyvinylphosphonic acid, a compound containing a sulfonic acid group, a saccharide compound and a silicate compound.

Among them, polyvinylphosphonic acid and a silicate compound are more preferable, and a silicate compound is most preferable.

The compound containing a sulfonic acid group includes an aromatic sulfonic acid, a condensation product of the aromatic sulfonic acid with formaldehyde, a derivative of the aromatic sulfonic acid and a salt of the aromatic sulfonic acid.

Examples of the aromatic sulfonic acid include phenolsulfonic acid, catecholsulfonic acid, resorcinolsulfonic acid, benzenesulfonic acid, toluenesulfonic acid, ligninsulfonic acid, naphthalenesulfonic acid, acenaphthene-5-sulfonic acid, phenanthrene-2-sulfonic acid, benzaldehyde-2(or 3)-sulfonic acid, benzaldehyde-2,4(or 3,5)-disulfonic acid, an oxybenzylsulfonic acid, sulfobenzoic acid, sulfanilic acid, naphthionic acid and taurine. Of the aromatic sulfonic acids, benzenesulfonic acid, naphthalenesulfonic acid and ligninsulfonic acid are preferred. Also, formaldehyde condensates of benzenesulfonic acid, naphthalenesulfonic acid and ligninsulfonic acid are preferred.

The sulfonic acid may be used in the form of a salt. Examples of the salt include a sodium salt, a potassium salt, a lithium salt, a calcium salt and a magnesium salt. Among them, a sodium salt and a potassium salt are preferred.

The pH of aqueous solution including the compound containing a sulfonic acid group is preferably from 4 to 6.5. The adjustment of pH to such a range can be made using, for example, sulfuric acid, sodium hydroxide or ammonia.

The saccharide compound includes a monosaccharide and a sugar alcohol thereof, an oligosaccharide, a polysaccharide and a glycoside.

Examples of the monosaccharide and a sugar alcohol thereof, include a triose (e.g., glycerol) and a sugar alcohol thereof, a tetrose (e.g., threose or erythritol) and a sugar alcohol thereof, a pentose (e.g., arabinose or arabitol) and a sugar alcohol thereof, a hexose (e.g., glucose or sorbitol) and a sugar alcohol thereof, a heptose (e.g., D-glycero-D-galactoheptose or D-glycero-D-galactoheptitol) and a sugar alcohol thereof, an octose (e.g., D-erythro-D-galactooctitol) and a sugar alcohol thereof, and a nonose (e.g., D-erythro-L-glucononulose) and a sugar alcohol thereof.

Examples of the oligosaccharide include a disaccharide, for example, saccharose, trehalose or lactose, and a trisaccharide, for example, raffinose.

Examples of the polysaccharide include amylose, arabinan, cyclodextrin and cellulose alginate.

The term "glycoside" as used herein means a compound wherein a saccharide moiety is connected to a non-saccharide moiety through, e.g., an ether linkage.

The glycosides can be classified according to the kind of non-saccharide moiety present therein. Examples thereof include an alkyl glycoside, a phenol glycoside, a coumarin glycoside, an oxycoumarin glycoside, a flavonoid glycoside, an anthraquinone glycoside, a triterpene glycoside, a steroid glycoside and a mustard oil glycoside.

The saccharide moiety includes moieties of a monosaccharide and a sugar alcohol thereof, an oligosaccharide and a polysaccharide as described above. Among them, a monosaccharide and oligosaccharide moieties are preferred, and a monosaccharide and disaccharide moieties are more preferred.

Preferred examples of the glycoside include compounds represented by the following formula (I):

(I)

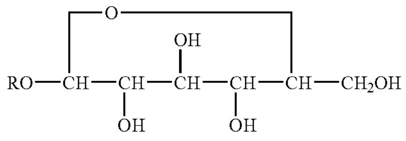

In formula (I), R represents a straight chain, branched or cyclic alkyl group having from 1 to 20 carbon atoms, a straight chain, branched or cyclic alkenyl group having from 2 to 20 carbon atoms or a straight chain, branched or cyclic alkynyl group having from 2 to 20 carbon atoms.

Examples of the alkyl group having from 1 to 20 carbon atoms include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl groups. The alkyl group may have a straight chain, branched or cyclic form.

Examples of the alkenyl group having from 2 to 20 carbon atoms include allyl and 2-butenyl groups. The alkenyl group may have a straight chain, branched or cyclic form.

Examples of the alkynyl group having from 2 to 20 carbon atoms include 1-pentynyl group. The alkynyl group may have a straight chain, branched or cyclic form.

Specific examples of the compound represented by formula (I) include methyl glucoside, ethyl glucoside, propyl glucoside, isopropyl glucoside, butyl glucoside, isobutyl glucoside, n-hexyl glucoside, octyl glucoside, capryl glucoside, decyl glucoside, 2-ethylhexyl glucoside, 2-pentylnonyl glucoside, 2-hexyldecyl glucoside, lauryl glucoside, myristyl glucoside, stearyl glucoside, cyclohexyl glucoside and 2-butynyl glucoside.

These compounds are glucosides as a variety of glycoside, wherein the hemiacetal hydroxy group of glucose is connected with other compound by an ether linkage. For instance, the glucoside can be obtained by reacting glucose with an alcohol in accordance with a known method. Some of the glucosides are marketed under the trade name of GLUCOPON from Henkel, Germany and they can be used in the invention.

Preferred examples of other glycosides include a saponin, rutin trihydrate, hesperidin methylchalcone, hesperidin, naringin hydrate, phenol-β-D-glucopyranoside, salicin and 3,5,7-methoxy-7-rutinoside.

The pH of aqueous solution including the saccharide compound is preferably from 8 to 11. The adjustment of pH to such a range can be made using, for example, potassium hydroxide, sulfuric acid, carbonic acid, sodium carbonate, phosphoric acid or sodium phosphate.

In the aqueous solution of polyvinylphosphonic acid, the concentration thereof is preferably from 0.1 to 5% by weight, and more preferably from 0.2 to 2.5% by weight. The immersion temperature is preferably from 10 to 70° C., and more preferably from 30 to 60° C. The immersion time is preferably from 1 to 20 seconds.

In the aqueous solution of compound containing a sulfonic acid group, the concentration thereof is preferably from 0.02 to 0.2% by weight. The immersion temperature is preferably from 60 to 100° C. The immersion time is preferably from 1 to 300 seconds, and more preferably from 10 to 100 seconds.

In the aqueous solution of saccharide, the concentration thereof is preferably from 0.5 to 10% by weight. The immersion temperature is preferably from 40 to 70° C. The immersion time is preferably from 2 to 300 seconds, and more preferably from 5 to 30 seconds.

In the invention, an aqueous solution of inorganic compound, for example, an aqueous solution of alkali metal silicate, an aqueous solution of potassium zirconium fluoride ($K_2ZrF_6$) or an aqueous solution of phosphate/inorganic fluorine compound can also be advantageously used as the aqueous solution containing a hydrophilic compound, in addition to the aqueous solution of organic compound as described above.

The treatment with the aqueous solution of alkali metal silicate is performed by immersing the support in an aqueous solution of alkali metal silicate having the concentration of preferably from 0.01 to 30% by weight, and more preferably from 0.1 to 10% by weight and the pH value (at 25° C.) of from 10 to 13 at a temperature of preferably from 30 to 100° C., and more preferably from 50 to 90° C. for preferably from 0.5 to 40 seconds, and more preferably from 1 to 20 seconds.

Examples of the alkali metal silicate for use in the hydrophilic surface treatment include the alkali metal silicates used in the sealing treatment solution containing at least one of a fluorine compound and a silicic acid compound as described above.

The aqueous solution of alkali metal silicate may contain an appropriate amount of a hydroxide, for example, sodium hydroxide, potassium hydroxide or lithium hydroxide for the purpose of raising the pH thereof. Among them, it is preferable to use sodium hydroxide or potassium hydroxide.

The aqueous solution of alkali metal silicate may also contain an alkaline earth metal salt or a salt of Group IV (Group IVB) metal. Examples of the alkaline earth metal salt and salt of Group IV (Group IVB) metal include the alkaline earth metal salts and salts of Group IV (Group IVB) metals, which may be included in the sealing treatment solution containing at least one of a fluorine compound and a silicic acid compound as described above. The alkaline earth metal salts and salts of Group IV (Group IVB) metals can be used individually or as a mixture of two or more thereof.

The treatment with the aqueous solution of potassium zirconium fluoride is performed by immersing the support in an aqueous solution of potassium zirconium fluoride having the concentration of preferably from 0.1 to 10% by weight, and more preferably from 0.5 to 2% by weight at a temperature of preferably from 30 to 80° C. for preferably from 60 to 180 seconds.

The treatment with the aqueous solution of phosphate/inorganic fluorine compound is performed by immersing the support in an aqueous solution of phosphate/inorganic fluorine compound having the phosphate concentration of preferably from 5 to 20% by weight and the inorganic fluorine compound concentration of preferably from 0.01 to 1% by weight and the pH value of from 3 to 5 at a temperature of preferably from 20 to 100° C. and more preferably from 40 to 80° C. for preferably from 2 to 300 seconds and more preferably from 5 to 30 seconds.

The phosphate for use in the invention includes a phosphate of metal, for example, an alkali metal or an alkaline earth metal.

Specific examples of the phosphate include zinc phosphate, aluminum phosphate, ammonium phosphate, diammonium hydrogenphosphate, ammonium dihydrogenphosphate, monoammonium phosphate, monopotassium phosphate, monosodium phosphate, potassium dihydrogenphosphate, dipotassium hydrogenphosphate, calcium phosphate, sodium ammonium hydrogenphosphate, magnesium hydrogenphosphate, magnesium phosphate, iron(II) phosphate, iron(III) phosphate, sodium dihydrogenphosphate, sodium phosphate, disodium hydrogenphosphate, lead phosphate, diammonium phosphate, calcium dihydrogenphosphate, lithium phosphate, phosphotungstic acid, ammonium phosphotungstate, sodium phosphotungstate, ammonium phosphomolybdate, sodium phosphomolybdate, sodium phosphite, sodium tripolyphosphate and sodium pyrophosphate. Of the phosphates, sodium dihydrogenphosphate, disodium hydrogenphosphate, potassium dihydrogenphosphate and dipotassium hydrogenphosphate are preferred.

The inorganic fluorine compound for use in the hydrophilic surface treatment preferably includes a metal fluoride.

Specific examples thereof include those described for the fluorine compound used in the sealing treatment solution containing at least one of a fluorine compound and a silicic acid compound as described above.

The solution for use in the treatment with phosphate/inorganic fluorine compound can contain one or more phosphates and one or more inorganic fluorine compounds.

After immersion treatment in the aqueous solution containing the hydrophilic compound, the support is washed, for example, with water, and then dried.

<Subbing Layer>

On the aluminum support (substrate) according to the invention as described above, an inorganic subbing layer comprising a water-soluble metal salt, for example, zinc borate or an organic subbing layer may be provided, if desired, prior to applying an image-forming layer (hereinafter also referred to as a heat-sensitive layer) capable of writing with infrared laser exposure.

Examples of the organic compound for use in the organic subbing layer include carboxymethyl cellulose, dextrin, gum arabic, a homopolymer or copolymer having a sulfonic acid group in the side chain thereof, polyacrylic acid, a phosphonic acid having an amino group (for example, 2-aminoethylphosphonic acid), an organic phosphonic acid (for example, phenylphosphonic acid, naphthylphosphonic acid, alkylphosphonic acid, glycerophosphonic acid, methylenediphosphonic acid or ethylenediphosphonic acid, each of which may be substituted), an organic phosphoric acid (for example, phenylphosphoric acid, naphthylphosphoric acid, alkylphosphoric acid or glycerophosphoric acid, each of which may be substituted), an organic phosphinic acid (for example, phenylphosphinic acid, naphthylphosphinic acid, alkylphosphinic acid or glycerophosphinic acid, each of which may be substituted), an amino acid (for example, glycine or β-alanine), a hydrochloride of an amine containing a hydroxy group (for example, triethanolamine hydrochloride), and a yellow dye. The organic compounds may be used individually or as a mixture of two or more thereof.

The organic subbing layer can be provided in the following manner. Specifically, the organic compound as described above is dissolved in water, an organic solvent, for example, methanol, ethanol or methyl ethyl ketone, or a mixture thereof, the solution thus prepared is applied to the aluminum support and dried to form the organic subbing layer. Alternatively, the organic compound as described above is dissolved in water, an organic solvent, for example, methanol, ethanol or methyl ethyl ketone, or a mixture thereof, the aluminum support is immersed in the solution thus prepared to adsorb the organic compound on the surface of aluminum support, then washed, for example, with water and dried to form the organic subbing layer.

In the former method, the concentration of the organic compound in the solution is preferably from 0.005 to 10% by weight. A method for the application of solution is nor particularly restricted and any method, for example, bar coater coating, spin coating, spray coating or curtain coating can be employed. In the latter method, the concentration of the organic compound in the solution is preferably from 0.01 to 20% by weight, and more preferably from 0.05 to 5% by weight. The immersion temperature is preferably from 20 to 90° C., and more preferably from 25 to 50° C. The immersion time is preferably from 0.1 second to 20 minutes, and more preferably from 2 seconds to one minute. The solution of organic compound may be used by adjusting the pH thereof in a range of from 1 to 12 with a basic substance, for example, ammonia, triethylamine or potassium hydroxide, or an acidic substance, for example, hydrochloric acid or phosphoric acid.

The coverage of the organic subbing layer after drying is preferably from 2 to 200 mg/$m^2$, and more preferably from 5 to 100 mg/$m^2$. In such a range of the dry coverage, the press life is more improved.

The interlayer comprising a high molecular weight compound having an acid group and an onium group as described in JP-A-11-109637 is also used as the subbing layer according to the invention.

[Heat-Sensitive Layer]

A lithographic printing plate precursor using the support for lithographic printing plate precursor according to the invention comprises a heat-sensitive layer formed on the layer of inorganic compound provided on the aluminum support or formed on the subbing layer optionally provided on the layer of inorganic compound as described above.

The heat-sensitive layer provided on the support for lithographic printing plate precursor according to the invention is not particularly restricted, as long as it is a heat-sensitive layer capable of forming an image with infrared laser exposure. Examples of the heat-sensitive layer include a heat-sensitive layer containing a fine particulate polymer having a thermally reactive functional group or a microcapsule enclosing a compound having a thermally reactive functional group, and a heat-sensitive layer that contains an infrared absorber and a high molecular compound insoluble in water but soluble in an aqueous alkali solution, changes the solubility in an alkali developer upon infrared laser exposure and is capable of writing with irradiation of infrared laser.

The lithographic printing plate precursor using the support for lithographic printing plate precursor according to the invention will be described below with reference to the heat-sensitive layer containing a fine particulate polymer having a thermally reactive functional group or a microcapsule enclosing a compound having a thermally reactive functional group.

In one preferred embodiment, the heat-sensitive layer of the lithographic printing plate precursor using the support for lithographic printing plate precursor according to the invention contains a fine particulate polymer having a thermally reactive functional group or a microcapsule enclosing a compound having a thermally reactive functional group.

Examples of the thermally reactive functional group include an ethylenically unsaturated group which performs a polymerization reaction (e.g., acryloyl group, methacryloyl group, vinyl group or allyl group); an isocyanate group or a blocked form thereof, which undergoes an addition reaction, and as another part of the reaction, a functional group having an active hydrogen atom (e.g., amino group, hydroxyl group or carboxyl group); an epoxy group which undergoes an addition reaction, and as another part of the reaction, an amino group, a carboxyl group or a hydroxyl group; a carboxyl group and a hydroxyl or amino group, which undergo a condensation reaction; an acid anhydride group and an amino or hydroxyl group, which undergo a ring-opening addition reaction; and a diazonium group, which is decomposed by heat to react, for example, with a hydroxy group. However, the thermally reactive functional group for use in the invention is not limited to these groups and any functional group that undergoes a reaction may be used, as far as a chemical bond is formed.

Examples of the thermally reactive functional group preferably used in the fine particulate polymer include an acryloyl group, a methacryloyl group, a vinyl group, an allyl group, an epoxy group, an amino group, a hydroxy group, a carboxy group, an isocyanate group, an acid anhydride group and groups formed by protecting these groups. The introduction of thermally reactive functional group into polymer particle is performed at polymerization to form the polymer or by utilizing a polymer reaction after the polymerization.

In the case of conducting the introduction of thermally reactive functional group at the polymerization, it is preferred that a monomer having the thermally reactive functional group is polymerized according to emulsion polymerization or suspension polymerization. A monomer free from the thermally reactive functional group may be used together as a copolymerization component at the polymerization, if desired.

Specific examples of the monomer having the thermally reactive functional group include allyl methacrylate, allyl acrylate, vinyl methacrylate, vinyl acrylate, glycidyl methacrylate, glycidyl acrylate, 2-isocyanatoethyl methacrylate, blocked isocyanate thereof with alcohol, 2-isocyanatoethyl acrylate, blocked isocyanate thereof with alcohol, 2-aminoethyl methacrylate, 2-aminoethyl acrylate, 2-hydroxyethyl methacrylate, 2-hydroxyethyl acrylate, acrylic acid, methacrylic acid, maleic anhydride, difunctional acrylate and difunctional methacrylate. However, the monomer having a thermally reactive functional group for use in the present invention is not limited thereto.

Examples of the monomer free from the thermally reactive functional group, which is copolymerizable with the monomer having a thermally reactive functional group, include styrene, alkyl acrylate, alkyl methacrylate, acrylonitrile and vinyl acetate. However, the monomer free from the thermally reactive functional group for use in the present invention is not limited thereto.

Examples of the polymer reaction for introducing the thermally reactive functional group into a polymer formed by polymerization include those described, for example, in WO 96/34316.

Among the fine particulate polymers having the thermally reactive functional group, fine particulate polymers capable of combining with each other upon heat are preferred and those having a hydrophilic surface and dispersible in water are more preferred. It is also preferred that a film formed by coating only the fine particulate polymer and drying it at a temperature lower than the melting point thereof preferably has a contact angle (water droplet in the air) lower than the contact angle (water droplet in the air) of a film formed by drying at a temperature higher than the melting point.

The surface of fine particulate polymer can be rendered hydrophilic by adsorbing a hydrophilic polymer or oligomer, for example, polyvinyl alcohol or polyethylene glycol, or a hydrophilic low molecular compound on the surface of fine particulate polymer, however, the method for hydrophilization of fine particulate polymer is not limited thereto.

The melting point of the fine particulate polymer is preferably not less than 70° C. and from the standpoint of aging stability, it is more preferably not less than 100° C.

The average particle size of the fine particulate polymer is preferably from 0.01 to 20 μm, more preferably from 0.05 to 2.0 μm, and still more preferably from 0.1 to 1.0 μm. When the average particle size is too large, resolution is deteriorated in some cases and on the other hand, when the average particle size is too small, the aging stability is deteriorated in some cases.

The amount of the fine particulate polymer added is preferably not less than 50% by weight, and more preferably not less than 60% by weight, based on the solid content of the heat-sensitive layer.

Examples of the thermally reactive functional group preferably used in the microcapsule include a polymerizable unsaturated group, a hydroxy group, a carboxy group, a carboxylato group, an acid anhydride group, an amino group, an epoxy group, an isocyanate group and a blocked isocyanate group. The thermally reactive functional groups may be used individually or in combination of two or more thereof.

A compound having the polymerizable unsaturated group is preferably a compound having at least one, preferably two or more ethylenically unsaturated bonds, for example, acryloyl group, methacryloyl group, vinyl group or allyl group. Such compounds are widely known in the field of art and they can be used without any particular restriction in the invention. The compound has a chemical form of a monomer, a prepolymer including a dimer, a trimer or an oligomer, a mixture thereof or a copolymer thereof.

Specific examples of the compound include an unsaturated carboxylic acid (e.g., acrylic acid, methacrylic acid, itaconic acid, crotonic acid, isocrotonic acid or maleic acid) and an ester or amide thereof. Among them, an ester of an unsaturated carboxylic acid with an aliphatic polyhydric alcohol and an amide of an unsaturated carboxylic acid with an aliphatic polyamine are preferred.

Also, an addition reaction product of an unsaturated carboxylic acid ester or unsaturated carboxylic acid amide having a nucleophilic substituent, for example, hydroxyl group, amino group or mercapto group with a monofunctional or polyfunctional isocyanate or epoxide, and a dehydration condensation reaction product of an unsaturated carboxylic acid ester or unsaturated carboxylic acid amide having a nucleophilic substituent with a monofunctional or polyfunctional carboxylic acid are preferably used.

Further, an addition reaction product of an unsaturated carboxylic acid ester or amide having an electrophilic substituent, for example, isocyanate group or epoxy group with a monofunctional or polyfunctional alcohol, amine or thiol, and a substitution reaction product of an unsaturated carboxylic acid ester or amide having a splitting-off substituent, for example, halogen atom or tosyloxy group with a monofunctional or polyfunctional alcohol, amine or thiol are also preferably used.

Moreover, compounds formed by replacing the unsaturated carboxylic acid described above with an unsaturated phosphonic acid or chloromethylstyrene are also used as other preferred examples of the compound.

Specific examples of the polymerizable compound which is an ester of an unsaturated carboxylic acid with an aliphatic polyhydric alcohol include an acrylic acid ester, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane diacrylate, trimethylolpropane triacrylate, trimethylolpropane tris(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tris(acryloyloxyethyl)isocyanurate or polyester acrylate oligomer; a methacrylic acid ester, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloyloxy-2-hydroxypropoxy)phenyl] dimethylmethane or bis[p-(methacryloyloxyethoxy)phenyl] dimethylmethane; an itaconic acid ester, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate; a crotonic acid ester, for example, ethylene glycol dicrotonate, tetramethylene glycol dicrotonate, pentaerythritol dicrotonate or sorbitol tetradicrotonate; an isocrotonic acid ester, for example, ethylene glycol diisocrotonate, pentaerythritol diisocrotonate or sorbitol tetraisocrotonate; and a maleic acid ester, for example, ethylene glycol dimaleate, triethylene glycol dimaleate, pentaerythritol dimaleate or sorbitol tetramaleate.

Other examples of the ester include the aliphatic alcohol esters described in JP-B-46-27926, JP-B-51-47334 and JP-A-57-196231, the esters having an aromatic skeleton described in JP-A-59-5240, JP-A-59-5241 and JP-A-2-226149, and the esters containing an amino group described in JP-A-1-165613.

Specific examples of the amide monomer of an aliphatic polyhydric amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other preferred examples of the amide monomer include those having a cyclohexylene structure described in JP-B-54-21726.

Urethane addition polymerizable compounds produced by using an addition reaction of an isocyanate with a hydroxy group are also preferably used and specific examples thereof include urethane compounds having two or more polymerizable unsaturated groups per molecule described in JP-B-48-41708, which are obtained by adding an unsaturated monomer having a hydroxy group represented by formula (II) shown below to a polyisocyanate compound having two or more isocyanate groups per molecule:

$$CH_2{=}C(R_1)COOCH_2CH(R_2)OH \qquad (II)$$

wherein $R_1$ and $R_2$ each represent H or $CH_3$.

Also, the urethane acrylates described in JP-A-51-37193, JP-B-2-32293 and JP-B-2-16765 and the urethane compounds having an ethylene oxide skeleton described in JP-B-58-49860, JP-B-56-17654, JP-B-62-39417 and JP-B-62-39418 are also preferably used.

Furthermore, the radical polymerizable compounds having an amino or sulfide structure within the molecule thereof described in JP-A-63-277653, JP-A-63-260909 and JP-A-1-105238 are preferably used.

Other preferable examples include polyfunctional acrylates and methacrylates, for example, the polyester acrylates and epoxy acrylates obtained by reacting an epoxy resin with a (meth)acrylic acid described in JP-A-48-64183, JP-B-49-43191 and JP-B-52-30490. In addition, the specific unsaturated compounds described in JP-B-46-43946, JP-B-1-40337 and JP-B-1-40336 and the vinyl phosphonic acid compounds described in JP-A-2-25493 are preferably used. In some cases, the compounds containing a perfluoroalkyl group described in JP-A-61-22048 are preferably used. Furthermore, the photocurable monomers or oligomers described in *Nihon Secchaku Kyokaishi* (*Japan Adhesion Association Magazine*), Vol. 20, No. 7, pages 300 to 308 (1984) are preferably used.

Preferred examples of the epoxy compound include glycerol polyglycidyl ether, polyethylene glycol diglycidyl ether, polypropylene glycol diglycidyl ether, trimethylol propane polyglycidyl ether, sorbitol polyglycidyl ether, polyglycidyl ethers of bisphenols, polyphenols and hydrogenated products thereof.

Preferred examples of the isocyanate compound include tolylene diisocyanate, diphenylmethane diisocyanate, polymethylene polyphenyl polyisocyanate, xylylene diisocyanate, naphthalene diisocyanate, cyclohexane phenylene diisocyanate, isophorone diisocyanate, hexamethylene diisocyanate, cyclohexyl diisocyanate and blocked compounds thereof with alcohols or amines.

Preferred examples of the amine compound include ethylenediamine, diethylenetriamine, triethylenetetramine, hexamethylenediamine, propylenediamine and polyethyleneimine.

Preferred examples of the compound having a hydroxy group include compounds having a terminal methylol group, polyhydric alcohols, for example, pentaerythritol, bisphenols and polyphenols.

Preferred examples of the compound having a carboxy group include aromatic polyvalent carboxylic acids, for example, pyromellitic acid, trimellitic acid or phthalic acid, and aliphatic polyvalent carboxylic acids, for example, adipic acid.

In addition, preferred examples of the compound having a hydroxy group or a carboxy group include the compounds employed as binders of known PS plates as described in JP-B-54-19773, JP-B-55-34929 and JP-B-57-43890.

Preferred examples of the acid anhydride include pyromellitic acid anhydride and benzophenonetetracarboxylic acid anhydride.

Preferred examples of the copolymer of an ethylenically unsaturated compound include copolymers of allyl methacrylate, for example, allyl methacrylate/methacrylic acid copolymer, allyl methacrylate/ethyl methacrylate copolymer and allyl methacrylate/butyl methacrylate copolymer.

Preferred examples of the diazo resin include hexafluorophosphate or aromatic sulfonate of diazodiphenylamine and formaldehyde condensate.

For the encapsulation, known methods can be used. Examples of the method for producing microcapsules include a method using coacervation described in U.S. Pat. Nos. 2,800,457 and 2,800,458, a method using interfacial polymerization described in British Patent 990,443, U.S. Pat. No. 3,287,154, JP-B-38-19574, JP-B-42-446 and JP-B-42-711, a method using polymer deposition described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall material described in U.S. Pat. Nos. 4,001,140, 4,087,376 and 4,089,802, a method using a wall material, for example, melamine-formaldehyde resin or hydroxy cellulose described in U.S. Pat. No. 4,025,455, a method of in situ polymerization of monomer described in JP-B-36-9163 and JP-A-51-9079, a spray drying method described in British Patent 930,422 and U.S. Pat. No. 3,111,407, and an electrolytic dispersion cooling method described in British Patents 952,807 and 967,074.

The wall of microcapsule for use in the invention preferably has a three-dimensionally crosslinked structure and a property of swelling with a solvent. From this point of view, the material for microcapsule wall is preferably polyurea, polyurethane, polyester, polycarbonate, polyamide or a mixture thereof, more preferably polyurea or polyurethane. Also, a compound having a thermally reactive functional group may be introduced into the microcapsule wall.

The average particle size of the microcapsule is preferably from 0.01 to 20 μm, more preferably from 0.05 to 2.0 μm, and particularly preferably from 0.10 to 1.0 μm. When the average particle size is too large, resolution may be deteriorated and on the other hand, when the average particle size is too small, the aging stability may be deteriorated.

The microcapsules may or may not be combined with each other upon heat. What is important is that the compound contained inside the microcapsule leaks out on the microcapsule surface or outside the microcapsule or penetrates into the microcapsule wall at the coating and causes a chemical reaction upon heat. The compound may react with a hydrophilic resin added or a low molecular compound added. Further, two or more microcapsules, which contain different functional groups capable of thermally reacting with each other respectively, may be reacted with each other.

Therefore, it is preferred in view of the image formation that the microcapsules are fused and combined upon heat, but it is not essential.

The amount of microcapsule added to the heat-sensitive layer is preferably from 10 to 60% by weight, and more preferably from 15 to 40% by weight in terms of the solid content of the layer. Within such a range, good on-machine developability and at the same time, high sensitivity and good press life can be obtained.

In the case of using the microcapsules in the heat-sensitive layer, a solvent that dissolves the component encapsulated and swells the wall material may be added to the microcapsule dispersion medium. By the addition of such a solvent, the encapsulated compound having a thermally reactive functional group can be accelerated to diffuse outside the microcapsule.

The solvent can be easily selected from a large number of commercially available solvents, although it depends on the microcapsule dispersion medium, the material for microcapsule wall, the wall thickness and the compound encapsulated therein. For example, in the case of a water-dispersible microcapsule comprising a crosslinked polyurea or polyurethane wall, preferred examples of the solvent include an alcohol, an ether, an acetal, an ester, a ketone, a polyhydric alcohol, an amide, amines and a fatty acid.

Specific examples thereof include methanol, ethanol, tertiary butanol, n-propanol, tetrahydrofurane, methyl lactate, ethyl lactate, methyl ethyl ketone, propylene glycol monomethyl ether, ethylene glycol diethyl ether, ethylene glycol monomethyl ether, γ-butyllactone, N,N-dimethylformamide and N,N-dimethylacetamide. However, the solvent for use in the invention should not be construed as being limited thereto. The solvents may be used in combination of two or more thereof.

A solvent, which is insoluble in the microcapsule dispersion solution but becomes soluble therein when mixed with the above-described solvent, may also be used.

The amount of solvent added can be determined according to the combination of materials used but is preferably from 5 to 95% by weight, more preferably from 10 to 90% by weight, and particularly preferably from 15 to 85% by weight, based on the coating solution.

In the case of using the fine particulate polymer having a thermally reactive functional group or microcapsules enclosing a compound having a thermally reactive functional group in the heat-sensitive layer, a compound that initiates or accelerates the reaction may further be added, if desired. The compound that initiates or accelerates the reaction includes, for example, a compound that generates a radical or a cation by heat. Specific examples thereof include a lophine dimer, a trihalomethyl compound, a peroxide, an azo compound, an onium salt including, for example, a diazonium salt or a diphenyl iodonium salt, an acylphosphine and a imidosulfonato.

Such a compound is preferably added in the range of from 1 to 20% by weight, and more preferably from 3 to 10% by weight based on the solid content of the heat-sensitive layer. Within such a range, a good reaction initiating or reaction accelerating effect can be obtained without impairing the on-machine developability.

A hydrophilic resin may be added to the heat-sensitive layer. By the addition of hydrophilic resin, not only the on-machine developability is improved but also film strength of the heat-sensitive layer per se is increased.

The hydrophilic resin preferably has a hydrophilic group, for example, a hydroxyl group, a hydroxyethyl group, a hydroxypropyl group, an amino group, an aminoethyl group, an aminopropyl group, a carboxy group, a carboxylato group, a sulfo group, a sulfonate group or a phosphoric acid group, Specific examples of the hydrophilic resin include gum arabic, casein, gelatin, starch derivatives, carboxymethyl cellulose and sodium salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of at least 60% by weight, preferably at least 80% by weight, polyvinyl formal, polyvinyl butyral, polyvinyl pyrrolidone, homopolymers and copolymers of acrylamide, homopolymers and copolymers of methacrylamide, and homopolymers and copolymers of N-methylolacrylamide.

The amount of hydrophilic resin added to the heat-sensitive layer is preferably from 5 to 40% by weight, and more preferably from 10 to 30% by weight. Within such a range, good on-machine developability and good film length can be obtained.

To the heat-sensitive layer, various compounds other than those described above may be added, if desired. For instance, a polyfunctional monomer can be added to the heat-sensitive layer matrix in order to more improve the press life. Examples of the polyfunctional monomer used include the monomers incorporated into the microcapsules described above. Particularly preferred monomer is trimethylolpropane triacrylate.

In the heat-sensitive layer, a dye having a large absorption in the visible region can be used as a colorant of the image in order to easily distinguish the image area from the non-image area after the image formation. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are produced by Orient Chemical Industries, Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247. Pigments, for example, phthalocyanine pigments, azo pigments or titanium oxide are also preferably used. The amount of dye or pigment added is preferably from 0.01 to 10% by weight based on the total solid content in the coating solution for heat-sensitive layer.

A slight amount of a thermal polymerization inhibitor is preferably added to a coating solution of the heat-sensitive layer in order to inhibit undesirable thermal polymerization during the preparation or storage of coating solution. Suitable examples of the thermal polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt. The amount of the thermal polymerization inhibitor added is preferably from about 0.01 to about 5% by weight based on the total solid content of the heat-sensitive layer.

If desired, a higher fatty acid or a derivative thereof, for example, behenic acid or behenic acid amide may be added and allowed to localize on the surface of the heat-sensitive layer during the process of drying after the coating in order to prevent polymerization inhibition by oxygen. The amount of higher fatty acid or derivative thereof added is preferably from about 0.1 to about 10% by weight based on the total solid content of the heat-sensitive layer.

To the heat-sensitive layer may further added, a plasticizer for imparting flexibility to the film coated, if desired. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

The heat-sensitive layer is prepared by dissolving the above-described necessary components in a solvent to prepare a coating solution and applying the coating solution to the support. Examples of the solvent used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, however, the invention should not be construed as being limited thereto. The solvents are used individually or as a mixture of two or more thereof. The concentration of solid content in the coating solution is preferably from 1 to 50% by weight.

The coating amount (solid content) of heat-sensitive layer obtained after the coating and drying on the support varies depending on the use but in general, is preferably from 0.5 to 5.0 $g/m^2$. When the coating amount is less than the above described range, film properties of the heat-sensitive layer acting as image recording are deteriorated, although apparent sensitivity increases. The coating can be conducted using various methods, for example, bar coater coating, spin coating, spray coating, curtain coating, dip coating, air knife coating, blade coating or roll coating.

To the coating solution for heat-sensitive layer may be added a surfactant, for example, a fluorine-containing surfactant as described, e.g., in JP-A-62-170950 in order to improve the coatability. The amount of surfactant added is preferably from 0.01 to 1% by weight, and more preferably from 0.05 to 0.5% by weight, based on the total solid content of the heat-sensitive layer.

[Overcoat Layer]

In the lithographic printing plate precursor using the support for lithographic printing plate precursor according to the invention, a water-soluble overcoat layer can be provided on the heat-sensitive layer for the purpose of preventing contamination on the surface of the heat-sensitive layer due to oleophilic substances.

The water-soluble overcoat layer is a layer that can be easily removed at the printing and contains a resin selected from water-soluble organic high molecular compounds. The water-soluble organic high molecular compound has an effect such that the coating formed after coating and drying the water-soluble organic high molecular compound has a film-forming ability. Specific examples thereof include polyvinyl acetate having a hydrolysis ratio of not less than 65%, a polyacrylic acid and its alkali metal salt or amine salt, a polyacrylic acid copolymer and its alkali metal salt or amine salt, a polymethacrylic acid and its alkali metal salt or amine salt, a polymethacrylic acid copolymer and its alkali metal salt or amine salt, a polyacrylamide and its copolymer, polyhydroxyethyl acrylate, polyvinyl pyrrolidone and its copolymer, polyvinyl methyl ether, a vinyl methyl ether/maleic acid anhydride copolymer, poly-2-acrylamido-2-methyl-1-propanesulfonic acid and its alkali metal salt or amine salt, poly-2-methacrylamido-2-methyl-1-propanesulfonic acid copolymer and its alkali metal salt or amine salt, gum arabic, a cellulose derivative (e.g., carboxymethyl cellulose, carboxyethyl cellulose or methyl cellulose) and its modified product, white dextrin, pullulan and enzymolysis etherified dextrin. The resins may be used as a mixture of two or more thereof according to the end.

The overcoat layer may contain a water-soluble or water-dispersible light-heat converting agent. Further, in the case of using an aqueous solution for the overcoat layer, the solution may contain a nonionic surfactant, e.g., polyoxyethylene nonylphenyl ether or polyoxyethylene dodecyl ether for the purpose of ensuring uniformity in coating.

The dry coating amount of overcoat layer is preferably from 0.1 to 2.0 g/m$^2$. Within such a range, the surface of the image-forming layer can be successfully prevented from the contamination due to oleophilic substances, for example, fingerprint without impairing the on-machine developability.

In the case wherein the heat-sensitive layer contains a fine particulate polymer having a thermally reactive functional group or a microcapsule enclosing a compound having a thermally reactive functional group, it is preferred that at least one of the heat-sensitive layer, the overcoat layer and the subbing layer contains a heat-light converting agent that absorbs infrared ray and generates heat. By the incorporation of heat-light converting agent, an infrared absorption efficiency is increased, thereby increasing the sensitivity.

The light-heat converting material is a light absorbing substance having at least partially an absorption band in a wavelength range of from 700 to 1,200 nm, and various pigments, dyes and metal fine particles can be used as the light-heat converting material.

Examples of the pigment which can be used include commercially available pigments and infrared absorbing pigments described in *Colour Index* (*C.I.*), Nippon Ganryo Gijutsu Kyokai ed., *Saishin Ganryo Binran* (*Handbook of Latest Pigments*), (1977), *Saishin Ganryo Oyo Gijutsu* (*Latest Pigment Application Technology*), CMC Publishing Co., Ltd. (1986), and *Insatsu Ink Gijutsu* (*Printing Ink Technology*), CMC Publishing Co., Ltd. (1984).

The pigment may be subjected to surface treatment before use, if desired, to enhance the dispersibility in a layer to which the pigment is added. Methods for the surface treatment include, for example, a method of coating a hydrophilic resin or an oleophilic resin on the pigment surface, a method of attaching a surfactant on the pigment surface, and a method of bonding a reactive substance (for example, a silica sol, an alumina sol, a silane coupling agent, an epoxy compound or an isocyanate compound) to the pigment surface.

The pigment added to the overcoat layer is preferably a pigment, a surface of which is coated with a hydrophilic resin or silica sol in order to be easily dispersed in the water-soluble resin and not to damage the hydrophilicity.

The particle size of pigment is preferably from 0.01 to 1 μm, and more preferably from 0.01 to 0.5 μm. For dispersing the pigment, known dispersion techniques for use in the production of ink or toner may be employed.

The pigment particularly preferred is carbon black.

Examples of the dye which can be used include commercially available dyes and known dyes described, for example, in Yuki Gosei Kagaku Kyokai ed., *Senryi Binran* (*Handbook of Dyes*), (1970), *Kagaku Kogyo* (*Chemical Industry*), "Near Infrared Absorbing Dyes", pages 45 to 51 (May, 1986), 90-*Nendai Kinousei Shikiso no Kaihatsu to Shijo Doko* (*Developments and Market Trends of Functional Dyes of the* 90*s*), Chap. 2, Item 2.3, CMC Publishing Co., Ltd. (1990) or various patents.

Specific examples of the dye include infrared absorbing dyes, for example, azo dyes, metal complex azo dyes, pyrazolone azo dyes, anthraquinone dyes, phthalocyanine dyes, carbonium dyes, quinoneimine dyes, polymethine dyes and cyanine dyes.

Other examples of the dye include the cyanine dyes described in JP-A-58-125246, JP-A-59-84356 and JP-A-60-78787, the methine dyes described in JP-A-58-173696, JP-A-58-181690 and JP-A-58-194595, the naphthoquinone dyes described in JP-A-58-112793, JP-A-58-224793, JP-A-59-48187, JP-A-59-73996, JP-A-60-52940 and JP-A-60-63744, the squarylium dyes described in JP-A-58-112792, the cyanine dyes described in British Patent 434,875, the dyes described in U.S. Pat. No. 4,756,993, the cyanine dyes described in U.S. Pat. No. 4,973,572, and the dyes described in JP-A-10-268512.

Further, the near infrared absorbing sensitizers described in U.S. Pat. No. 5,156,938 are preferably used as the dye. Moreover, the substituted arylbenzo(thio)pyrylium salts described in U.S. Pat. No. 3,881,924, the trimethinethiapyrylium salts described in JP-A-57-142645, the pyrylium compounds described in JP-A-58-181051, JP-A-58-220143, JP-A-59-41363, JP-A-59-84248, JP-59-84249, JP-A-59-146063 and JP-A-59-146061, the cyanine dyes described in JP-A-59-216146, the pentamethinethiapyrylium salts described in U.S. Pat. No. 4,283,475, the pyrylium compounds described in JP-B-5-13514 and JP-B-5-19702, Epolight III-178, Epolight III-130, and Epolight III-125 (produced by Epolin Inc.) are preferably used.

Among these dyes, those preferably added to the overcoat layer, a binder polymer of the heat-sensitive layer or the subbing layer are water-soluble dyes. Specific examples thereof are set forth below.

(IR-1)

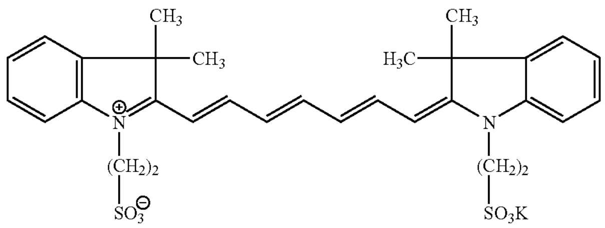

(IR-2)

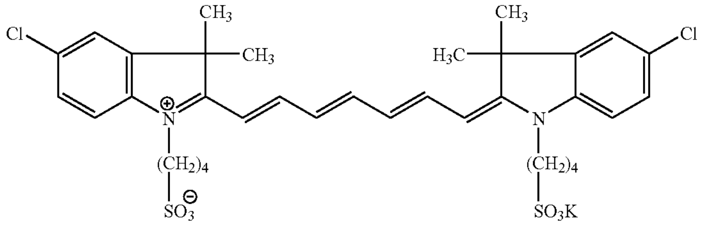

(IR-3)

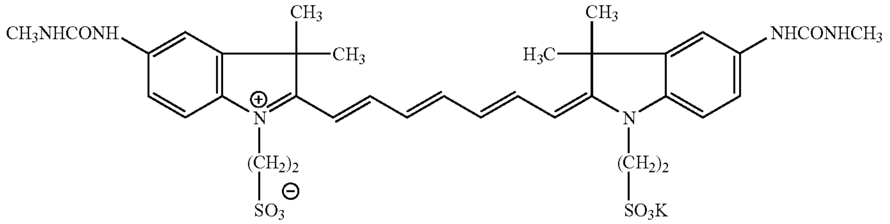

(IR-4)

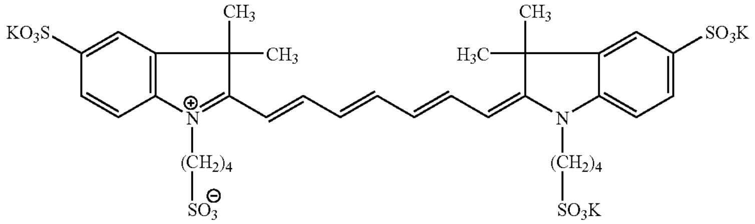

(IR-5)

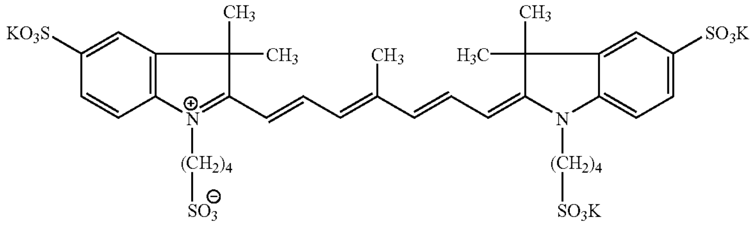

(IR-6)

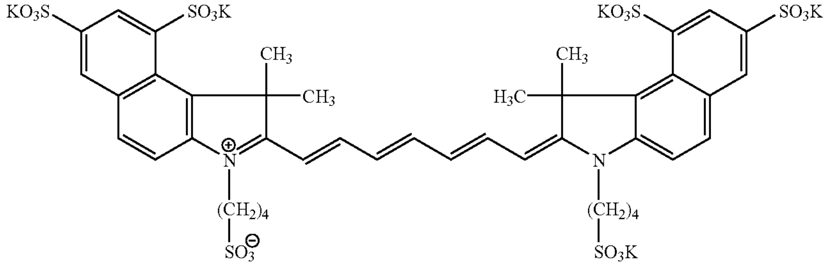

-continued
(IR-7)
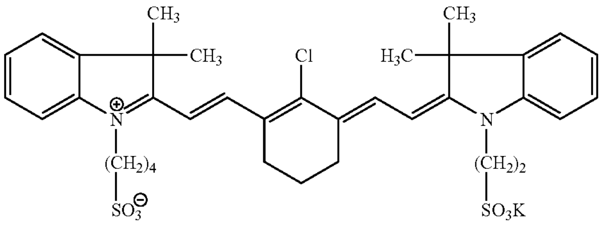
(IR-8)
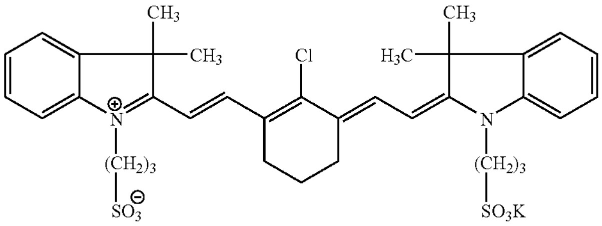
(IR-9)
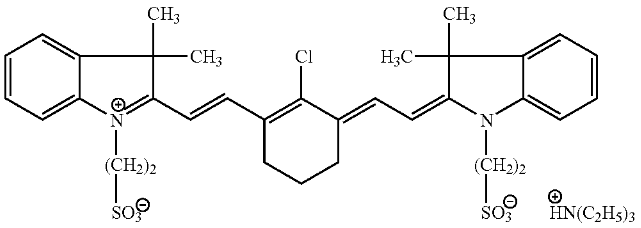
(IR-10)
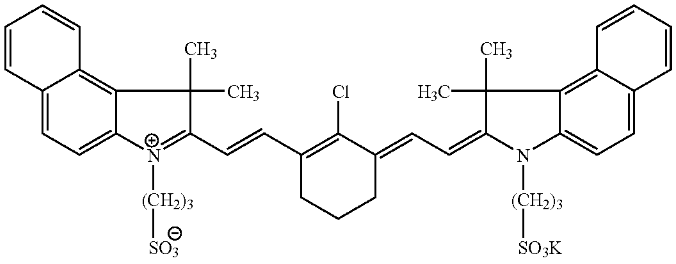
(IR-11)
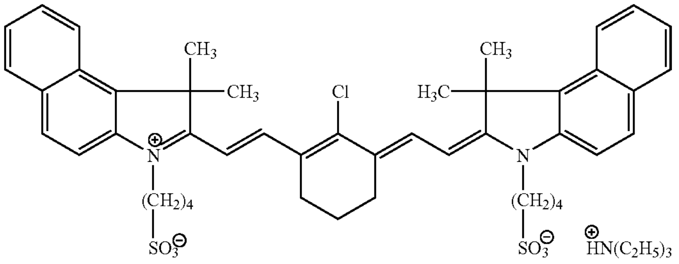
As the light-heat converting agent used together with the oleophilic compound having the thermally reactive functional group incorporated into microcapsules in the heat-sensitive layer, oleophilic dyes are more preferably employed, while the infrared absorbing dyes described above can be used. Specific examples of such dyes include the cyanine dyes set forth below.

(IR-12)

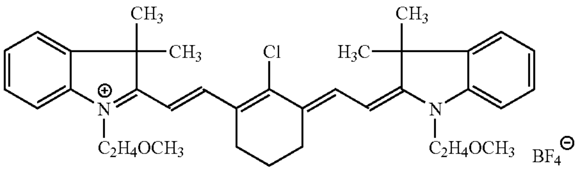

(IR-13)

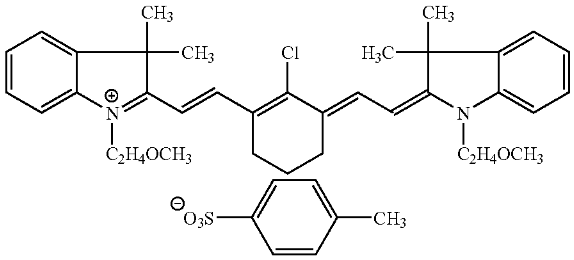

(IR-14)

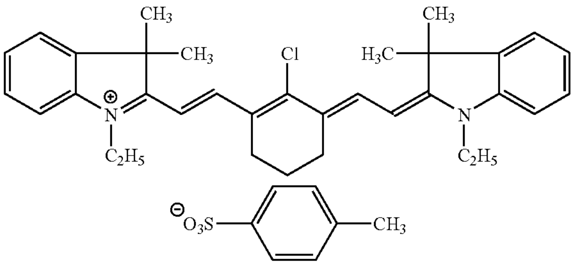

(IR-15)

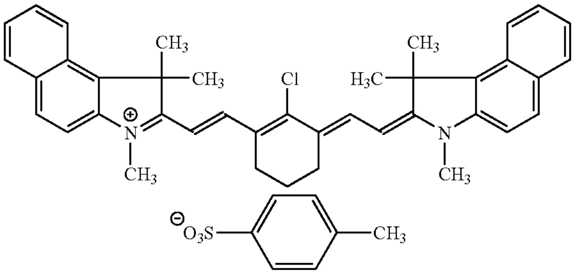

(IR-16)

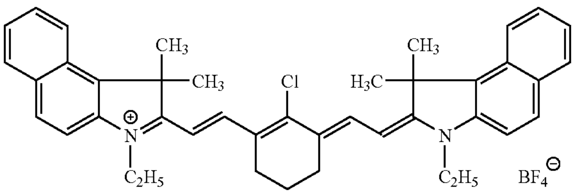

In the heat-sensitive layer, metal fine particles can also be used as the light-heat converting agent. Many metal fine particles are light-heat convertible and self-exothermic. Preferred examples of the metal fine particle include fine particles of Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re and Sb as an element or an alloy, and oxides and sulfides thereof.

Among the metals for constituting the metal fine particle, those preferred are metals having a melting point of not higher than 1,000° C. so as to easily combine with each other upon heat at the irradiation of light and an absorption in the infrared, visible or ultraviolet region, for example, Re, Sb, Te, Au, Ag, Cu, Ge, Pb or Sn.

Among them, those particularly preferred are metals having a relatively low melting point and a relatively high absorbance of infrared ray, for example, Ag, Au, Cu, Sb, Ge or Pb. Most preferred elements are Ag, Au and Cu.

Two or more light-heat converting substances, for example, a mixture of fine particles of metal having a low melting point, for example, Re, Sb, Te, Au, Ag, Cu, Ge, Pb or Sn, and fine particles of a self-exothermic metal, for example, Ti, Cr, Fe, Co, Ni, W or Ge may be employed. A combination of fine pieces of a metal which exhibits particularly large light absorption in the form of fine piece, for example, Ag, Pt or Pd, with other metal fine pieces is also preferably used.

The average particle size of the particles is preferably not more than 10 μm, more preferably from 0.003 to 5 μm, and particularly preferably from 0.01 to 3 μm. As the particle size is smaller, the coagulation temperature decreases, in other words, the photosensitivity in the heat mode advantageously increases, but the particles become difficult to be dispersed. On the other hand, when the particle size exceeds 10 μm, the resolution of printed matter may decrease in some cases.

In the case of using the pigment or dye as the light-heat converting agent, the amount thereof added to the heat-sensitive layer is preferably up to 30% by weight, more preferably from 5 to 25% by weight, and particularly preferably 7 to 20% by weight, based on the total solid content of the heat-sensitive layer. When the pigment or dye light-heat converting agent is added to the overcoat layer, the amount thereof is preferably from 1 to 70% by weight, and more preferably from 2 to 50% by weight, based on the total solid content of the overcoat layer.

In the above described range, preferable sensitivity is obtained. When the light-heat converting agent is added to the overcoat layer, the amount of light-heat converting agent added to the heat-sensitive layer and the subbing layer can be reduced or the light-heat converting agent is not added thereto depending on the amount thereof added to the overcoat layer.

In the case of using the metal fine particle as the light-heat converting agent, the amount thereof added to the heat-sensitive layer is preferably not less than 10% by weight, more preferably not less than 20% by weight, and particularly preferably not less than 30% by weight, based on the total solid content of the heat-sensitive layer. When the amount is less than 10% by weight, the sensitivity may decrease in some cases. The upper limit of the amount thereof is preferably 50% by weight based on the total solid content of the heat-sensitive layer from the standpoint of image strength.

On the lithographic printing plate precursor using the support for lithographic printing plate precursor according to the invention, an image is formed by heat. More specifically, direct imagewise recording by a thermal recording head or the like, scanning exposure by an infrared laser beam, high-illuminance flash exposure by a xenon discharge lamp or exposure by an infrared lamp may be used. The exposure using a semiconductor laser radiating an infrared ray having a wavelength of from 700 to 1,200 nm or a solid high output infrared laser, for example, YAG laser is preferred.

The imagewise exposed lithographic printing plate precursor using the support for lithographic printing plate precursor according to the invention is developed using water or an appropriate aqueous solution as a developer, thereby using for printing.

Also, in the case of using the heat-sensitive layer containing a fine particulate polymer having a thermally reactive functional group or a microcapsule enclosing a compound having a thermally reactive functional group, the imagewise exposed lithographic printing plate precursor can be mounted on a printing machine without passing through any more processing and used for printing according to an ordinary procedure using ink and dampening water. In the above case, the lithographic printing plate precursor can be mounted on a cylinder of a printing machine, exposed by a laser loaded on the printing machine, and then developed on the printing machine by applying dampening water and/or ink as described in Japanese Patent No. 2938398.

The invention will be described in greater detail with reference to the following examples, however, the invention should not be construed as being limited thereto.

EXAMPLE 1

1. Production of Support for Lithographic Printing Plate Precursor

An aluminum plate (defined as JIS A1050) having a thickness of 0.24 mm was sequentially subjected to the treatments shown below to prepare an aluminum support.

(a) Etching Treatment with Alkali Agent

The aluminum plate was subjected to etching treatment by spraying an aqueous solution containing sodium hydroxide in concentration of 26 wt % and an aluminum ion in concentration of 6.5 wt % at 70° C., thereby dissolving 6 g/m$^2$ of the aluminum plate. The plate was then washed by spraying water.

(b) Desmut Treatment

The aluminum plate was subjected to desmut treatment by spraying an aqueous solution containing nitric acid in concentration of 1 wt % (containing 0.5 wt % of aluminum ion) at 30° C., and then washed by spraying water. The aqueous solution of nitric acid used in the desmut treatment was waste liquid from the step for electrochemical surface roughening treatment using an aqueous solution of nitric acid by alternating current described below.

(c) Electrochemical Surface Roughening Treatment

The electrochemical surface roughening treatment was continuously performed by alternating current of 60 Hz. The electrolyte used was an aqueous solution containing nitric acid in concentration of 1 wt % (containing 0.5 wt % of aluminum ion and 0.007 wt % of ammonium ion) and the temperature was 50° C. The electrochemical surface roughening treatment was conducted with an alternating current of a trapezoidal waveform having time TP necessary for reaching the current from 0 to a peak value of 2 msec and a duty ratio of 1:1, and using a carbon electrode as a counter electrode. A ferrite was used as an auxiliary anode.

The electric current density was 30 A/dm$^2$ at a peak value of electric current, and the quantity of electricity was 270 C/dm$^2$ in terms of the total quantity of electricity during the aluminum plate functioning as an anode. Five percent of the electric current from the electric source was diverted to the auxiliary anode. The aluminum plate was then washed by spraying water.

(d) Etching Treatment

The aluminum plate was subjected to etching treatment by spraying an aqueous solution containing sodium hydroxide in concentration of 26 wt % and an aluminum ion in concentration of 6.5 wt % at 70° C., thereby dissolving 0.2 g/m$^2$ of the aluminum plate. Thus, the smut component mainly comprising aluminum hydroxide, which had been formed in the electrochemical surface roughening treatment using alternating current in the prior step, was removed, and also the edge portions of the bits formed were dissolved to smooth the edge portions. The aluminum plate was then washed by spraying water.

(e) Desmut Treatment

The aluminum plate was subjected to desmut treatment by spraying an aqueous solution containing nitric acid in concentration of 25 wt % (containing 0.5 wt % of aluminum ion) at 60° C., then washed by spraying water and dried, thereby preparing Substrate 1.

(f) Anodic Oxidation Treatment

Substrate 1 was subjected to anodic oxidation treatment in an anodic oxidation treatment solution containing a sulfuric acid in concentration of 170 g/liter (containing 0.5 wt % of aluminum ion) with a direct current voltage under conditions that the current density of 5 A/dm$^2$, the treatment temperature of 43° C. and the treatment time of 33 seconds, to form an anodic oxide film. The concentration of anodic oxidation treatment solution was kept constant by means of determining concentration of solution in consideration of temperature, specific gravity and electric conductivity with reference to a table previously prepared based on a relationship of sulfuric acid concentration and aluminum ion concentration with the temperature, specific gravity and electric conductivity, and adding water and 50 wt % sulfuric acid according to feedback control based on the concentration of solution. The aluminum plate was then washed by spraying water. The amount of anodic oxide film was 3 g/m$^2$.

(g) Pore Widening Treatment

Substrate 1 subjected to the anodic oxidation treatment was immersed in an aqueous solution of sodium hydroxide of pH 13 at temperature of 50° C. for 30 seconds, and then washed with water and dried, thereby performing the pore widening treatment. Thus, the pore diameter of the anodic oxide film was increased from 10 nm to 20 nm.

(h) Formation of Layer of Inorganic Compound Particles

Using Substrate 1 subjected to the pore widening treatment, an aqueous suspension containing 0.5 wt % of colloidal alumina particles (AS200 produced by Nissan Chemical Industries, Ltd.; heat conductivity: 36 W/(m·K)) having a particle size of from 10 to 100 nm was applied to the Substrate 1 by means of a bar coater so as to have a coating amount after drying of 0.05 g/m$^2$ and dried using an oven at 100° C. for 2 minutes, thereby forming the layer of inorganic compound particles.

(i) Sealing Treatment

Substrate 1 subjected to the formation of layer of inorganic compound particles was immersed without delay in a 10 wt % aqueous solution of sodium silicate No. 3 to perform the sealing treatment. The temperature of treating solution was 70° C. and the immersion time was 14 seconds. Substrate 1 was then washed by spraying water and dried, whereby a support for lithographic printing plate precursor having the anodic oxide film formed thereon and the layer of inorganic compound provided on the anodic oxide film according to the invention was obtained. The pore diameter of the layer of inorganic compound was substantially 0.

(j) Formation of Heat-Sensitive Layer

A coating solution for heat-sensitive layer as shown below was coated on the thus-obtained support for lithographic printing plate precursor and dried, whereby a lithographic printing plate precursor was obtained.

Specifically, a coating solution 1 for heat-sensitive layer having the composition shown below was prepared, coated on the above described support for lithographic printing plate precursor with a bar coater so as to have a coating amount after drying (coating amount of the heat-sensitive layer) of 0.7 $g/m^2$, and dried using an oven at 100° C. for 60 seconds to form a heat-sensitive layer, thereby preparing a lithographic printing plate precursor.

<Composition of Coating Solution for Heat-Sensitive Layer>

| | |
|---|---|
| Microcapsule solution shown below | 25 g (solid content: 5 g) |
| Trimethylolpropane triacrylate | 3 g |
| Infrared absorbing dye (IR-11) described hereinbefore | 0.3 g |
| Water | 60 g |
| 1-Methoxy-2-propanol | 1 g |

<Microcapsule Solution>

In 60 g of ethyl acetate were dissolved 40 g of xylylene diisocyanate, 10 g of trimethylolpropane diacrylate, 10 g of a copolymer of allyl methacrylate and butyl methacrylate (molar ratio: 7/3) and 0.1 g of a surfactant (Pionin A41C produced by Takemoto Oil & Fat Co., Ltd.) to prepare an oil phase component. Separately, 120 g of a 4% aqueous solution of polyvinyl alcohol (PVA205 produced by Kuraray Co., Ltd.) was prepared as an aqueous phase component. The oil phase component and the aqueous phase component were put in a homogenizer and emulsified at 10,000 rpm for 10 minutes. Then, 40 g of water was added to the emulsion and the mixture was stirred at room temperature for 30 minutes, followed by further stirring at 40° C. for 3 hours, thereby preparing a microcapsule solution. The concentration of solid content of thus-prepared microcapsule solution was 20 wt % and the average particle size of microcapsule was 0.5 μm.

EXAMPLE 2

A lithographic printing plate precursor according to the invention was prepared in the same manner as in Example 1 except that Substrate 1 subjected to the formation of layer of inorganic compound particles was immersed in an aqueous solution containing 4.5 g of NaF and 585 g of $Na_2HPO_4$ in 3,910 g of water (pH 4.3) at 60° C. for 10 seconds, then immersed in a 1 wt % aqueous solution of sodium silicate No. 3 at 30° C. for 60 seconds as a step of (k) hydrophilization treatment, washed by spraying water and dried to perform sealing treatment in place of the treatment with a 10 wt % aqueous solution of sodium silicate No. 3 to perform the step of (i) sealing treatment. The pore diameter of the layer of inorganic compound was substantially 0.

COMPARATIVE EXAMPLE 1

A lithographic printing plate precursor was prepared in the same manner as in Example 1 except that the step of (g) pore widening (PS) treatment, the step of (h) formation of layer of inorganic compound particles and the step of (i) sealing treatment were omitted as shown in Table 1 below.

COMPARATIVE EXAMPLE 2

A lithographic printing plate precursor was prepared in the same manner as in Example 1 except that the step of (h) formation of layer of inorganic compound particles and the step of (i) sealing treatment were omitted as shown in Table 1 below.

COMPARATIVE EXAMPLES 3 TO 7

Lithographic printing plate precursors were prepared in the same manner as in Examples 1 and 2 except for changing the kind of the layer of inorganic compound particles, conducting or not conducting the sealing treatment, and changing the kind of the sealing treatment solution in the step of (h) formation of layer of inorganic compound particles and the step of (i) sealing treatment as shown in Table 1 below, respectively.

COMPARATIVE EXAMPLES 8 TO 9

Lithographic printing plate precursors were prepared in the same manner as in Examples 1 and 2 except that the the step of (i) sealing treatment was omitted and that the kind of the hydrophilization treatment solution in the step of (k) hydrophilization treatment was changed as shown in Table 1 below, respectively.

COMPARATIVE EXAMPLE 10

A lithographic printing plate precursor was prepared in the same manner as in Example 1 except that Substrate 1 subjected to the formation of layer of inorganic compound particles was immersed in an aqueous solution containing 300 g of $H_2SO_4$ per liter at 30° C. for 60 seconds, washed by spraying water and dried to perform sealing treatment as shown in Table 1 below in place of the treatment with a 10 wt % aqueous solution of sodium silicate No. 3 to perform the step of (i) sealing treatment.

(Evaluations)

1. Micropore Diameter of Anodic Oxide Film or Inorganic Compound Layer of Support for Lithographic Printing Plate Precursor:

With each lithographic printing plate precursor, a micropore diameter of the surface of support in the non-image area after development processing was determined from SEM photographs obtained by observation of the micropore diameter of the surface with a scanning electron microscope (S-900 produced by Hitachi, Ltd.) by 150,000 magnifications at an accelerating voltage of 12 kV without performing vacuum evaporation. Fifty micropores were selected at random and an average value obtained therefrom was defined as a pore diameter as shown in Table 1 below.

2. Measurement Method of Concentration of F and Si:

The anodic oxide film (including the inorganic compound layer) was etched little by little from the surface using a micro Auger measurement device (Auger Analyzer SAM-Model 680 produced by ULVAC-PHI, Inc.) with $Ar^+$ at an accelerating voltage of 3 kV and a etching rate of 30 nm/min (calculated in terms of $SiO_2$), and distribution of F (fluorine) and Si (silicon) in depth was measured every 30 seconds. A ratio of the fluorine concentration or a ratio of the silicon concentration of the layer of inorganic compound to the anodic oxide film was determined according to the following equation:

Ratio=[fluorine (or silicon) concentration at the surface portion (the layer of inorganic compound)]/[fluorine (or silicon) concentration at the center of the anodic oxide film]

3. Sensitivity of Lithographic Printing Plate Precursor:

Each lithographic printing plate precursor was imagewise exposed at 2,400 dpi using a plate setter (Trendsetter 3244F loading multi-beam of 192 channels, produced by Creo Inc.) after adjusting various parameters (Sr, Sd, bmslope and bmcurve). The exposure was performed with varying the rotation number of the drum and the output stepwise. After the exposure, the lithographic printing plate precursor was subjected to development processing on a printing machine, and the quantity of energy necessary for forming 1% dot was taken as the sensitivity of lithographic printing plate precursor. The results obtained are shown in Table 1 below.

4. Measurement of Hydrophilicity (Contact Angle):

A sample of the support was immersed in oil (Swasol), then water droplet was dropped on the surface thereof and a contact angle between the surface of the support and the water droplet was measured by a contact angle measurement device (CA-X produced by Kyowa Interface Science Co., Ltd.). The smaller the contact angle, the higher the hydrophilicity is.

5. Press Life and Number of Inked Sheets:

Each exposed lithographic printing plate precursor was mounted on a printing machine, and after supplying dampening water, ink was supplied on the surface of lithographic printing plate precursor to perform development processing on the printing machine, subsequently printing was conducted. Sprint produced by Komori Corp. was used as the printing machine, Geos Black (produced by Dainippon Ink and Chemicals Inc.) was used as the ink, and a mixture of 90 vol % of a solution prepared by diluting dampening water (EU-3 produced by Fuji Photo Film Co., Ltd.) with water 100 times and 10 vol % of isopropanol was used as the dampening water. Also, high quality paper was used for the printing.

The printing was performed under the above conditions, and a number of papers until the ink did not adhere to the image area was measured to evaluate the press life. The number of papers until the ink did not adhere to the image area in Comparative Example 1 was taken as 100 and that in each of Comparative Examples 2 to 10 and Examples 1 to 2 was determined relatively. The results obtained are shown in Table 1 below.

Separately, each exposed lithographic printing plate precursor was mounted on a printing machine, and supply of dampening water, supply of ink and supply of printing paper were started at the same time. A number of waste paper until adhesion of ink to a region corresponding to the non-image area of print was terminated and the non-image area free from stain was formed was determined to evaluate the number of inked sheets. The less the number of waste paper, the more excellent the number of inked sheets is. The results obtained are shown in Table 1 below.

As is apparent from the results shown in Table 1, the lithographic printing plate precursors (in Examples 1 and 2) using the support for lithographic printing plate precursor of the invention are excellent in all of the sensitivity, hydrophilicity, number of inked sheets and press life.

On the contrary, in the cases wherein the layer of inorganic compound is omitted (in Comparative Examples 1 and 2), wherein the average particle size of the inorganic compound particles used is too small or the sealing treatment is omitted (in Comparative Examples 3, 4, 5, 6, 7, 8 and 9) and wherein the sealing treatment is conducted using sulfuric acid as the sealing treatment solution (in. Comparative Example 10), at least one of properties of the sensitivity, hydrophilicity, number of inked sheets and press life is defective.

TABLE 1

| | Anodic oxidation Treatment | PW Treatment | Pore Diameter of Anodic Oxide Film | Particle for Iorganic Compound Layer | Shape of Particle Size of Particle (nm) | Sealing Treatment | Sealing Treatment Solution |
|---|---|---|---|---|---|---|---|
| Comparative Example 1 | Sulfuric Acid (3 g/m$^2$) | No | 10 nm | — | — | No | — |
| Comparative Example 2 | Sulfuric Acid (3 g/m$^2$) | Yes | 20 nm | — | — | No | — |
| Comparative Example 3 | Sulfuric Acid (3 g/m$^2$) | Yes | 20 nm | ST-XS | Spherical (4 to 6) | No | — |
| Comparative Example 4 | Sulfuric Acid (3 g/m$^2$) | Yes | 20 nm | ST-20 | Spherical (10 to 20) | No | — |
| Comparative Example 5 | Sulfuric Acid (3 g/m$^2$) | Yes | 20 nm | ST-20 | Spherical (10 to 20) | Yes | NaF/$Na_2HPO_4$ |
| Comparative Example 6 | Sulfuric Acid (3 g/m$^2$) | Yes | 20 nm | AS520 | Spherical (10 to 20) | No | — |
| Comparative Example 7 | Sulfuric Acid (3 g/m$^2$) | Yes | 20 nm | AS520 | Spherical (10 to 20) | Yes | NaF/$Na_2HPO_4$ |
| Comparative Example 8 | Sulfuric Acid (3 g/m$^2$) | Yes | 20 nm | AS200 | Feathered (10 to 100) | No | — |
| Comparative Example 9 | Sulfuric Acid (3 g/m$^2$) | Yes | 20 nm | AS200 | Feathered (10 to 100) | No | — |
| Example 1 | Sulfuric Acid (3 g/m$^2$) | Yes | 20 nm | AS200 | Feathered (10 to 100) | Yes | Silicate |
| Example 2 | Sulfuric Acid (3 g/m$^2$) | Yes | 20 nm | AS200 | Feathered (10 to 100) | Yes | NaF/$Na_2HPO_4$ |
| Comparative Example 10 | Sulfuric Acid (3 g/m$^2$) | Yes | 20 nm | AS200 | Feathered (10 to 100) | Yes | $H_2SO_4$ |

TABLE 1-continued

| | Hydro-philization Treatment | Ratio of Pore Diameter | Ratio of F/Si Concentration | Sensitivity ($mJ/cm^2$) | Hydrophilicity (Contact Angle) | Number of Inked Sheets | Press Life |
|---|---|---|---|---|---|---|---|
| Comparative Example 1 | Silicate | — | 1 | 300 | 3° | 30 | 100 |
| Comparative Example 2 | Silicate | — | 1 | 200 | 3° | 100 | 150 |
| Comparative Example 3 | Silicate | 1.0 | 1 | 200 | 0° | 90 | 80 |
| Comparative Example 4 | Silicate | 1.0 | 1.2 | 200 | 0° | 50 | 80 |
| Comparative Example 5 | Silicate | 3.0 | 1.4 | 150 | 0° | 50 | 120 |
| Comparative Example 6 | Silicate | 1.0 | 1.4 | 150 | 7° | 60 | 80 |
| Comparative Example 7 | Silicate | 4.0 | 1.8 | 150 | 10° | 20 | 100 |
| Comparative Example 8 | No | 20.0 | — | 150 | 5° | 40 | 120 |
| Comparative Example 9 | PVPh | 20.0 | — | 150 | 20° | 40 | 140 |
| Example 1 | No | ∞ | 5 | 150 | 4° | 20 | 180 |
| Example 2 | Silicate | ∞ | 5 | 150 | 2° | 20 | 180 |
| Comparative Example 10 | Silicate | 20.0 | 1 | 150 | 6° | 40 | 100 |

Note:
Particle for Inorganic Compound Layer:
ST-XS, ST-20: Colloidal silica (ST) produced by Nissan Chemical Industries, Ltd.
AS520, AS200: Colloidal alumina (AS) produced by Nissan Chemical Industries, Ltd.
Sealing Treatment Solution:
NaF/Na2HPO4: NaF( 4.5 g)/$Na_2HPO_4$(585 g)/Water (3,910 g)
Silicate: Sodium silicate No. 3 (10%), 70° C., 14 sec.
$H_2SO_4$: 300 g/liter solution, 60° C., 40 sec.
Hydrophilization Treatment:
Silicate: Sodium silicate No. 3 (1%), 30° C., 60 sec.
PVPh: Polyvinyl phosphonic acid (1%) aqueous solution, 60° C., 40 sec.

In the method for the production of a support for a lithographic printing plate precursor and the support for a lithographic printing plate precursor according to the invention, which is suitably applied to a thermal type lithographic printing plate precursor, the specific layer of inorganic compound particles is provided on the micropore present in the anodic oxide film and the layer of inorganic compound particles is treated with a treating solution capable of dissolving the inorganic compound particles, thereby fusing together the inorganic compound particles to form a layer of the inorganic compound as described above. Thus, both heat insulation effect due to the layer of inorganic compound and heat insulation effect due to the void of micropore are obtained so that the diffusion of heat from the heat-sensitive layer to the aluminum support can be sufficiently restrained and the heat can be efficiently utilized for the image formation. Therefore, a support for a lithographic printing plate precursor that is suitably employed for a thermal positive type or thermal negative type lithographic printing plate precursor or a on machine developing type lithographic printing plate precursor, which has high sensitivity and excellent press life and in which the occurrence of stain in the non-image area is restrained, can be obtained according to the invention. The invention is extremely useful.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A method for the production of a support for a lithographic printing plate precursor that comprises:

providing on a grained aluminum support having an anodic oxide film formed thereon a layer of inorganic compound particles having a major axis larger than a pore diameter of the anodic oxide film;

treating the layer of inorganic compound particles with a treating solution capable of dissolving the inorganic compound particles, the treating solution comprising a compound containing fluorine, thereby fusing together the inorganic compound particles to form a layer of the inorganic compound; and conducting a hydrophilic surface treatment with an aqueous solution containing a silicate.

2. The method for production of a support for a lithographic printing plate precursor as claimed in claim 1, wherein the inorganic compound particles comprises at least one selected from the group consisting of $Al_2O_3$, $TiO_2$, $SiO_2$ and $ZrO_2$.

3. The method for production of a support for a lithographic printing plate precursor as claimed in claim 1, wherein the layer of inorganic compound particles is provided by coating and drying an aqueous solution containing the inorganic compound particles.

4. The method for production of a support for a lithographic printing plate precursor as claimed in claim 3, wherein the aqueous solution contains colloidal alumina particles.

5. The method for production of a support for a lithographic printing plate precursor as claimed in claim 1, wherein the treating solution contains a metal fluoride.

6. A support for a lithographic printing plate precursor that comprises a grained aluminum support having an anodic oxide film formed thereon and a layer of inorganic compound particles provided on the anodic oxide film, wherein a ratio of pore diameter of the layer of inorganic compound to pore diameter of the anodic oxide film is not less than 1.5; a ratio of fluorine concentration of the layer of inorganic compound to fluorine concentration of the anodic oxide film is not less than 2; and a ratio of silicon concentration of the layer of inorganic compound to silicon concentration of the anodic oxide film is not less than 2.

* * * * *